(12) United States Patent
Sohn et al.

(10) Patent No.: US 9,076,542 B2
(45) Date of Patent: Jul. 7, 2015

(54) MEMORY SYSTEM HAVING VARIABLE OPERATING VOLTAGE AND RELATED METHOD OF OPERATION

(71) Applicants: Dong Hyun Sohn, Hwaseong-si (KR); Chan Kyung Kim, Hwaseong-si (KR); Yun Sang Lee, Yongin-si (KR)

(72) Inventors: Dong Hyun Sohn, Hwaseong-si (KR); Chan Kyung Kim, Hwaseong-si (KR); Yun Sang Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 16 days.

(21) Appl. No.: 14/077,274

(22) Filed: Nov. 12, 2013

(65) Prior Publication Data

US 2014/0146600 A1  May 29, 2014

(30) Foreign Application Priority Data

Nov. 26, 2012 (KR) .................. 10-2012-0134265

(51) Int. Cl.
G11C 11/00 (2006.01)
G11C 11/14 (2006.01)
G11C 11/36 (2006.01)
G11C 11/16 (2006.01)

(52) U.S. Cl.
CPC ................ *G11C 11/1697* (2013.01)

(58) Field of Classification Search
USPC .......................... 365/158, 171, 173
See application file for complete search history.

(56) References Cited

U.S. PATENT DOCUMENTS

| | | | |
|---|---|---|---|
| 6,791,876 B2 | 9/2004 | Tanizaki et al. | |
| 6,873,561 B2 * | 3/2005 | Ooishi | 365/158 |
| 7,154,772 B2 | 12/2006 | Nahas et al. | |
| 7,515,457 B2 | 4/2009 | Chen et al. | |
| 7,742,329 B2 | 6/2010 | Yoon et al. | |
| 7,764,536 B2 | 7/2010 | Luo et al. | |
| 8,077,508 B1 * | 12/2011 | Ong | 365/158 |
| 8,411,497 B2 * | 4/2013 | Ong et al. | 365/158 |
| 8,760,920 B2 * | 6/2014 | Kim et al. | 365/158 |
| 8,908,428 B2 * | 12/2014 | Ong et al. | 365/158 |

FOREIGN PATENT DOCUMENTS

JP  2007122838  1/2007

* cited by examiner

*Primary Examiner* — Trong Phan
(74) *Attorney, Agent, or Firm* — Volentine & Whitt, PLLC

(57) ABSTRACT

A magneto-resistive random access memory (MRAM) including an MRAM cell array having an MRAM cell, and a control and voltage generation unit configured to generate a back bias voltage for the MRAM cell. The control and voltage generation unit including a command decoder configured to generate a decoding signal in response to a command output from a memory controller, and a voltage controller and generator configured to generate the back bias voltage with a magnitude based on the decoding signal and a reset signal output from the memory controller.

15 Claims, 34 Drawing Sheets

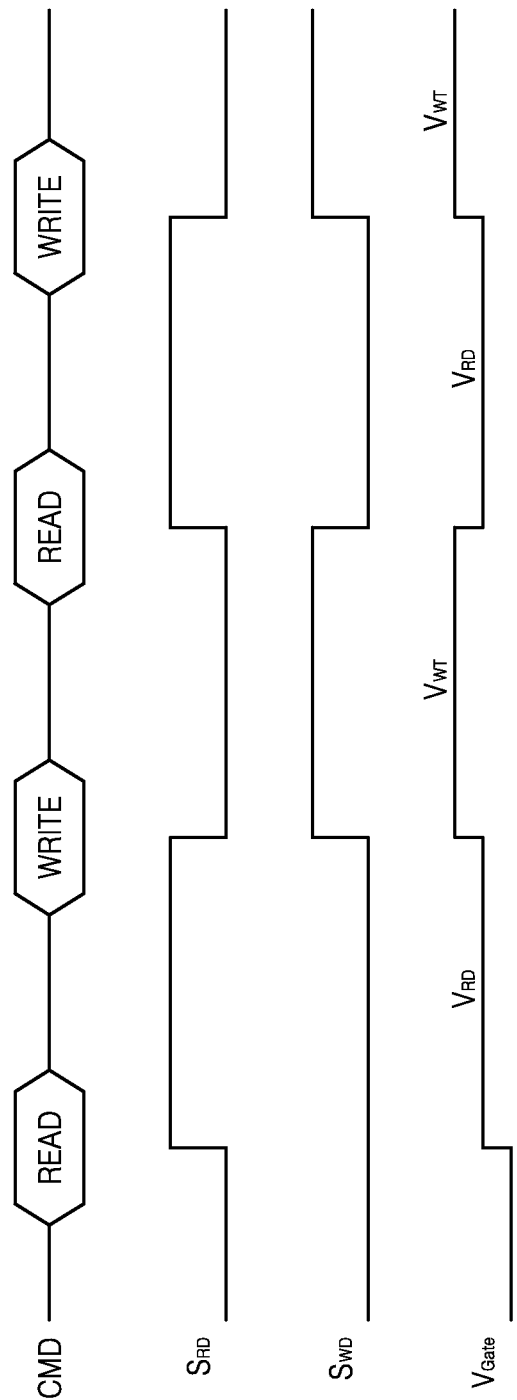

FIG. 9A

<2bits>

Table 1

| Voltage Selection Signal(VOSS) | Voltage Level(SV/OV) |
|---|---|
| 11 | 2.5V |
| 10 | 2.0V |
| 01 | 1.5V |
| 00 | 1.0V |

FIG. 9B

<3bits>

Table 2

| Voltage Selection Signal(VOSS) | Voltage Level(SV/OV) |
|---|---|
| 111 | 4.5/8.0V |
| 110 | 4.0/7.0V |
| ... | ... |
| 001 | 1.5/2.0V |
| 000 | 1.0/1.0V |

MEMORY SYSTEM HAVING VARIABLE OPERATING VOLTAGE AND RELATED METHOD OF OPERATION

CROSS-REFERENCE TO RELATED APPLICATIONS

This application claims priority under 35 U.S.C. §119(a) to Korean Patent Application No. 10-2012-0134265 filed on Nov. 26, 2012, the subject matter of which is hereby incorporated by reference in its entirety.

BACKGROUND OF THE INVENTION

The inventive concept relates generally to electronic memory technologies. More particularly, certain embodiments of the inventive concept relate to memory systems having a variable operating voltage and related methods of operation.

In general, the operation of a semiconductor chip may be affected by environmental factors, such as variations in both the internal and external conditions of the chip. Example factors that may affect the operation of a semiconductor chip include temperature variation, operating voltage variations, initial process variations, and resistance variation.

The above variations may contribute to operational errors and performance degradation. Moreover, these variations can have a larger impact in devices where operating margins are relatively tight, e.g., in memory devices high integration density or high speed operation. Accordingly, in an effort to maintain reliability and performance, researchers continue to develop new techniques for addressing changes in operating conditions of devices such as those typically implemented in semiconductor chips.

SUMMARY OF THE INVENTION

In one embodiment of the inventive concept, a magnetoresistive random access memory (MRAM) comprises an MRAM cell array having an MRAM cell, and a control and voltage generation unit configured to generate a back bias voltage for the MRAM cell. The control and voltage generation unit comprises a command decoder configured to generate a decoding signal in response to a command output from a memory controller, and a voltage controller and generator configured to generate the back bias voltage with a magnitude based on the decoding signal and a reset signal output from the memory controller.

In another embodiment of the inventive concept, a memory system comprises a memory controller comprising a control unit configured to generate a command and a voltage selection signal, and an MRAM comprising a MRAM cell array having an MRAM cell, and a control and voltage generation unit configured to generate an operating voltage for the MRAM cell. The control and voltage generation unit comprises a command decoder configured to generate a decoding signal in response to the command, and a voltage controller and generator configured to generate the operating voltage with a magnitude determined by the decoding signal and the voltage selection signal.

In yet another embodiment of the inventive concept, a memory system comprises a memory controller comprising a control unit configured to generate a command and a reset signal, and an MRAM comprising an MRAM cell array having an MRAM cell, and a control and voltage generation unit configured to generate a back bias voltage for the MRAM cell. The control and voltage generation unit comprises a command decoder configured to generate a decoding signal in response to the command, and a voltage controller and generator configured to generate the back bias voltage with a magnitude based on the decoding signal and the reset signal.

These and other embodiments of the inventive concept can potentially improve reliability, operating speed, and power consumption of a memory system including an MRAM by adjusting operating voltages according to existing operating conditions.

BRIEF DESCRIPTION OF THE DRAWINGS

The drawings illustrate selected embodiments of the inventive concept. In the drawings, like reference numbers indicate like features.

FIG. 6 is a timing diagram illustrating the operation of a voltage controller and generator according to an embodiment of the inventive concept.

FIG. 9A is a table illustrating values of a 2-bit voltage selection signal and a voltage level, according to an embodiment of the inventive concept.

FIG. 9B is another table illustrating values of a 3-bit voltage selection signal and a voltage level, according to an embodiment of the inventive concept.

DETAILED DESCRIPTION

Embodiments of the inventive concept are described below with reference to the accompanying drawings. These embodiments are presented as teaching examples and should not be construed to limit the scope of the inventive concept.

Figure 1:
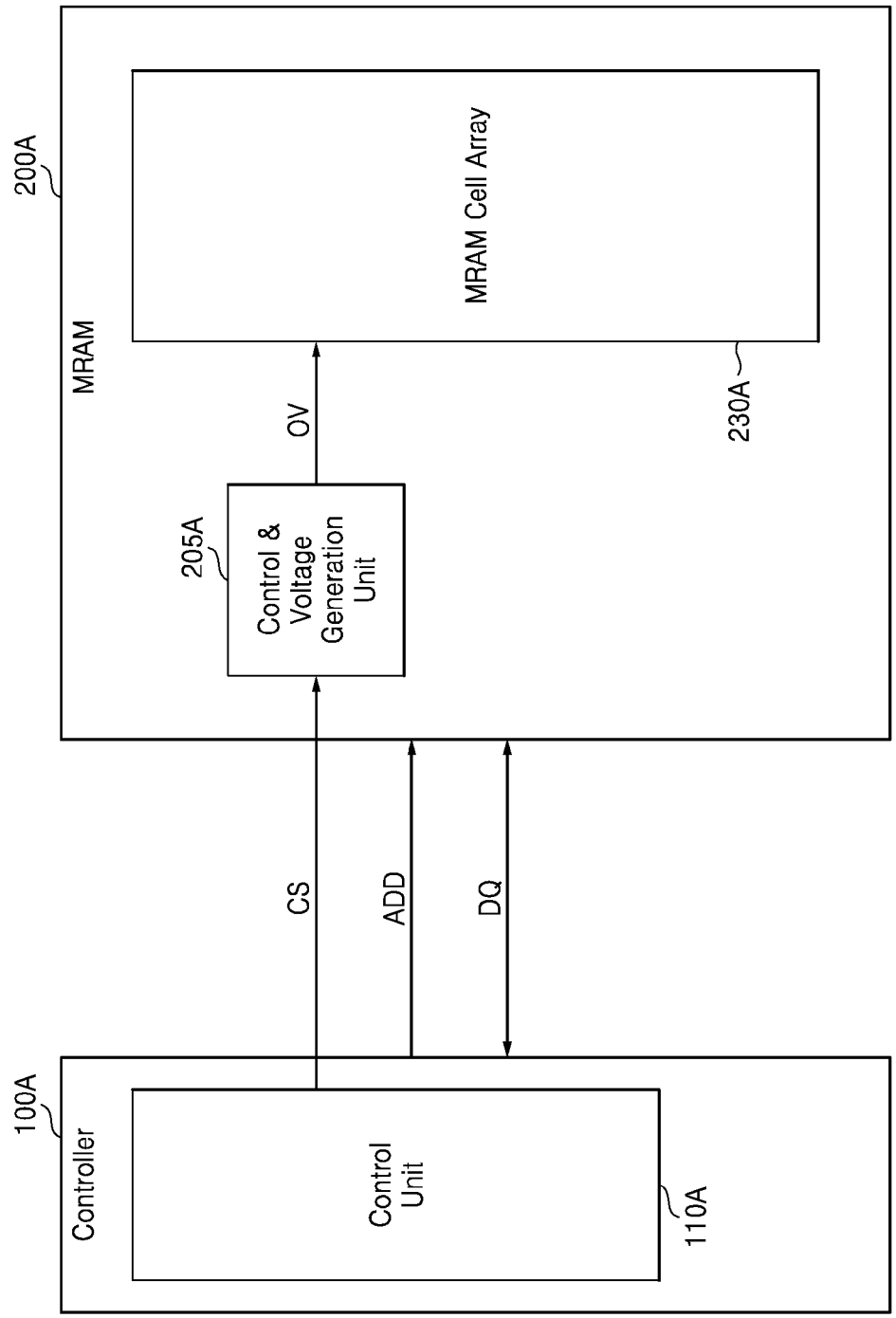
FIG. 1 is a block diagram illustrating a memory system according to an embodiment of the inventive concept.

FIG. 1 is a block diagram illustrating a memory system according to an embodiment of the inventive concept.

Referring to FIG. 1, the memory system comprises a controller 100A and an MRAM 200A.

Controller 100A is a memory controller, and it can be manufactured in a single chip with a central processing unit (CPU), or in another chip. Controller 100A comprises a control unit 110A that generates various signals such as a control signal CS, an address ADD, and data DQ. Signals CS, ADD, and DQ are transmitted to the MRAM or MRAM device 200A. Control signal CS typically comprises a write command, a read command, and/or a voltage selection signal.

MRAM 200A comprises an MRAM cell array 230A, and a control and voltage generation unit 205A. MRAM cell array 230A comprises multiple MRAM cells. Control and voltage generation unit 205A generates an operating voltage OV for performing a write operation or a read operation for MRAM cell array 230A. Operating voltage OV, which is generated in response to the read command or the write command, is provided to MRAM cell array 230A.

Figure 2:
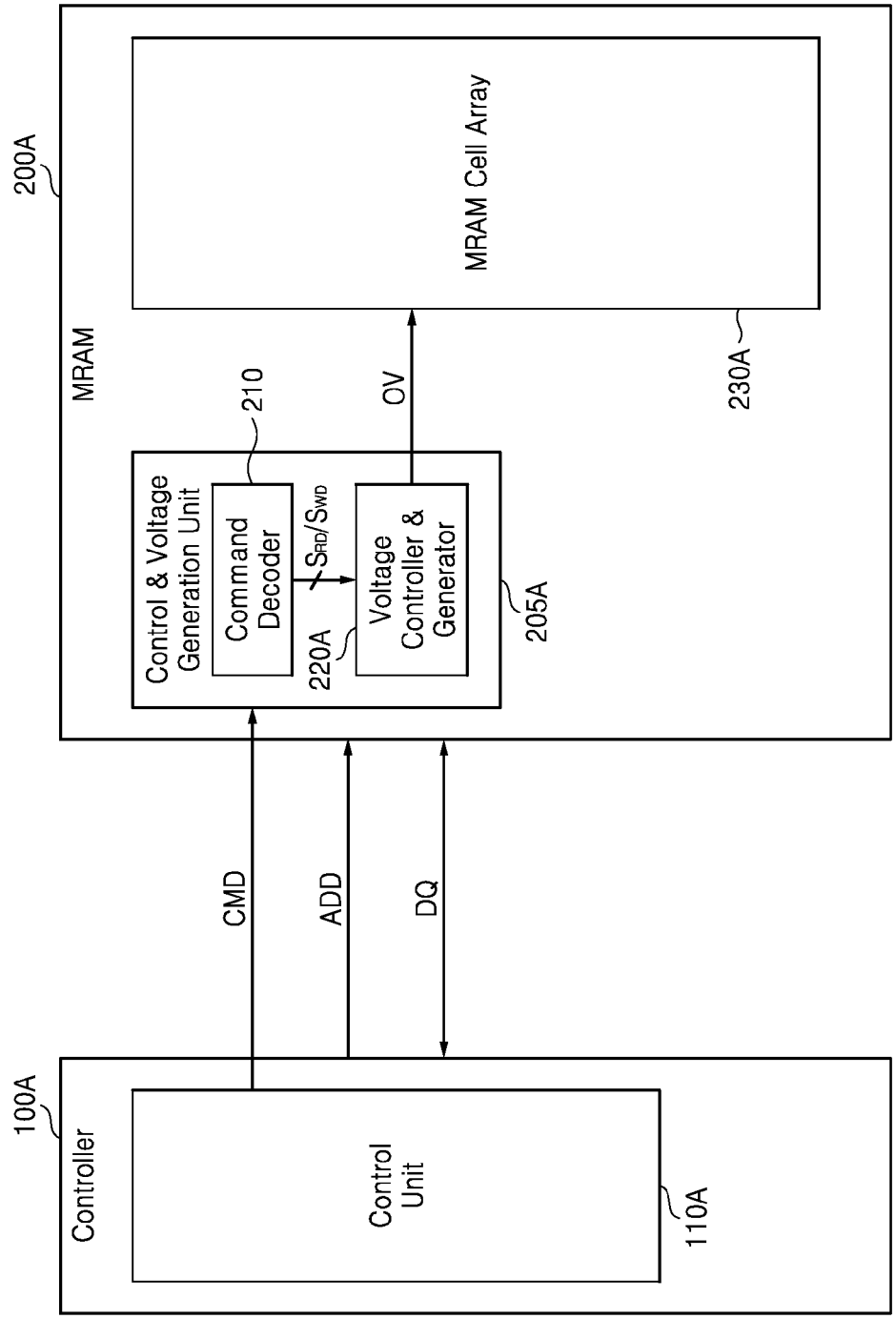
FIG. 2 is a block diagram illustrating a memory system according to another embodiment of the inventive concept.

FIG. 2 is a block diagram illustrating a memory system according to another embodiment of the inventive concept. The memory system of FIG. 2 is a more specific example of the memory system of FIG. 1.

Referring to FIG. 2, control signal CS comprises a command CMD. Command CMD may be, for instance, a write command or a read command, and command CMD transmitted to MRAM 200A.

MRAM 200A receives command CMD through a command decoder 210 of control and voltage generation unit 205A. Command decoder 210 generates a first decoding signal SRD or a second decoding signal SWD in response to the read or write command.

First decoding signal SRD or second decoding signal SWD is transmitted to a voltage controller and generator 220A. Voltage controller and generator 220A generates an operating voltage OV for a read operation or a write operation of MRAM 200A in response to first decoding signal SRD or second decoding signal SWD, and it provides the generated operating voltage OV to MRAM cell array 230A. An operating voltage OV for performing a read operation or a write operation on MRAM cell array 230A or MRAM core is generated in response to the read command or a write command.

Figure 3:
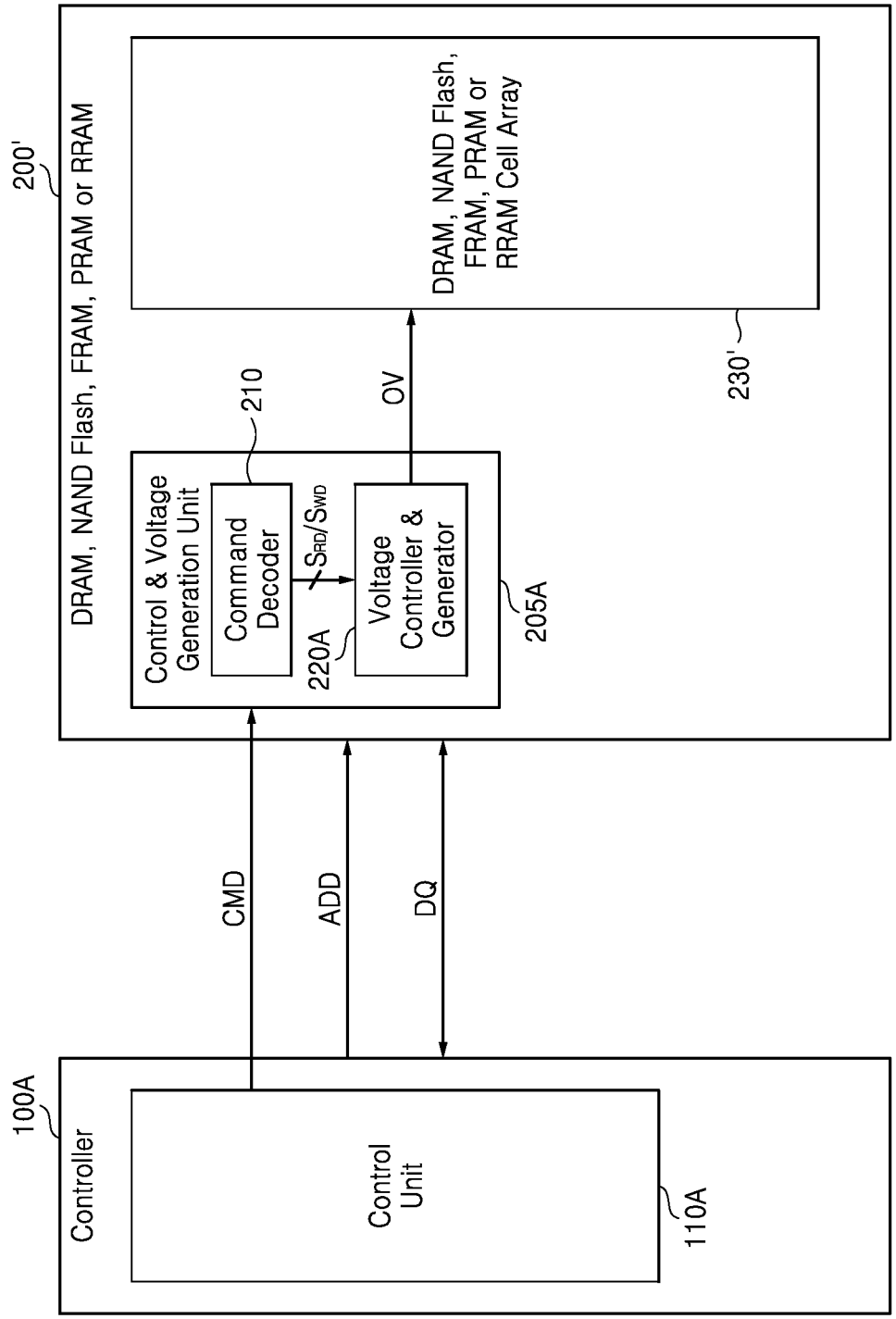
FIG. 3 is a block diagram illustrating a memory system according to another embodiment of the inventive concept.

FIG. 3 is a block diagram illustrating a memory system according to another embodiment of the inventive concept. The memory system of FIG. 3 is a more specific example of the memory system of FIG. 2.

Referring to FIG. 3, the memory system may comprise one of various forms of memory, such as a dynamic random access memory (DRAM), a NAND flash memory, a ferroelectric RAM (FRAM), a phase-change RAM (PRAM), or a resistive RAM (RRAM), for instance.

MRAM cell array 230A of FIG. 2 may be replaced with a DRAM cell array, a NAND flash memory cell array, a FRAM cell array, a PRAM cell array or a RRAM cell array 230'. The inventive concept is not restricted to the above described memory; however, the concepts may be applied to all semiconductor devices requiring an operating voltage OV such as a non-volatile memory or a volatile memory.

Figure 4:
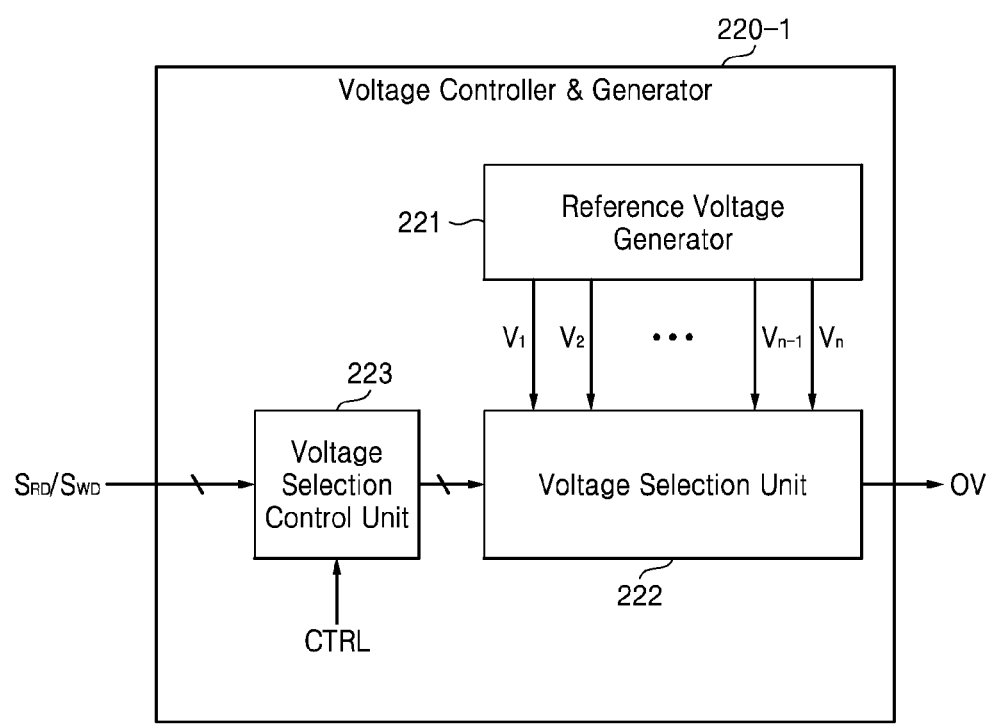
FIG. 4 is a block diagram illustrating a voltage controller and generator according to an embodiment of the inventive concept.

FIG. 4 is a block diagram illustrating a voltage controller and generator according to an embodiment of the inventive concept. The illustrated voltage controller and generator could be used in control and voltage generation unit 210, for example.

Referring to FIG. 4, a voltage controller and generator 220-1 comprises a reference voltage generator 221, a voltage selection unit 222, and a voltage selection control unit 223.

Reference voltage generator 221 generates multiple reference voltages V1, V2, ..., Vn−1, Vn. Voltage selection unit 222 selects at least one of reference voltages V1, V2, ..., Vn−1, Vn based on selection signals output from voltage selection control unit 223. Voltage selection control unit 223 generates selection signals in response to a first decoding signal SRD or a second decoding signal SWD.

The selected reference voltage is used as an operating voltage OV for an operation of MRAM cell array 230A or 230'. Voltage selection control unit 223 receives a first decoding signal SRD and/or a second decoding signal SWD transmitted from command decoder 210.

To reduce power consumption of semiconductor device 200A or 200' during certain modes of operation, a control signal CTRL provided to voltage selection control unit 223 may be activated or inactivated. For example, where an operation of semiconductor device 200A or 200' does not need to be activated, control signal CTRL may be inactivated. In addition, where a voltage change is not necessary, control signal CTRL is fixed, so that only a constant voltage may be applied. In some embodiments, voltage selection control unit 223 may be omitted from voltage controller and generator 220.

Figure 5:
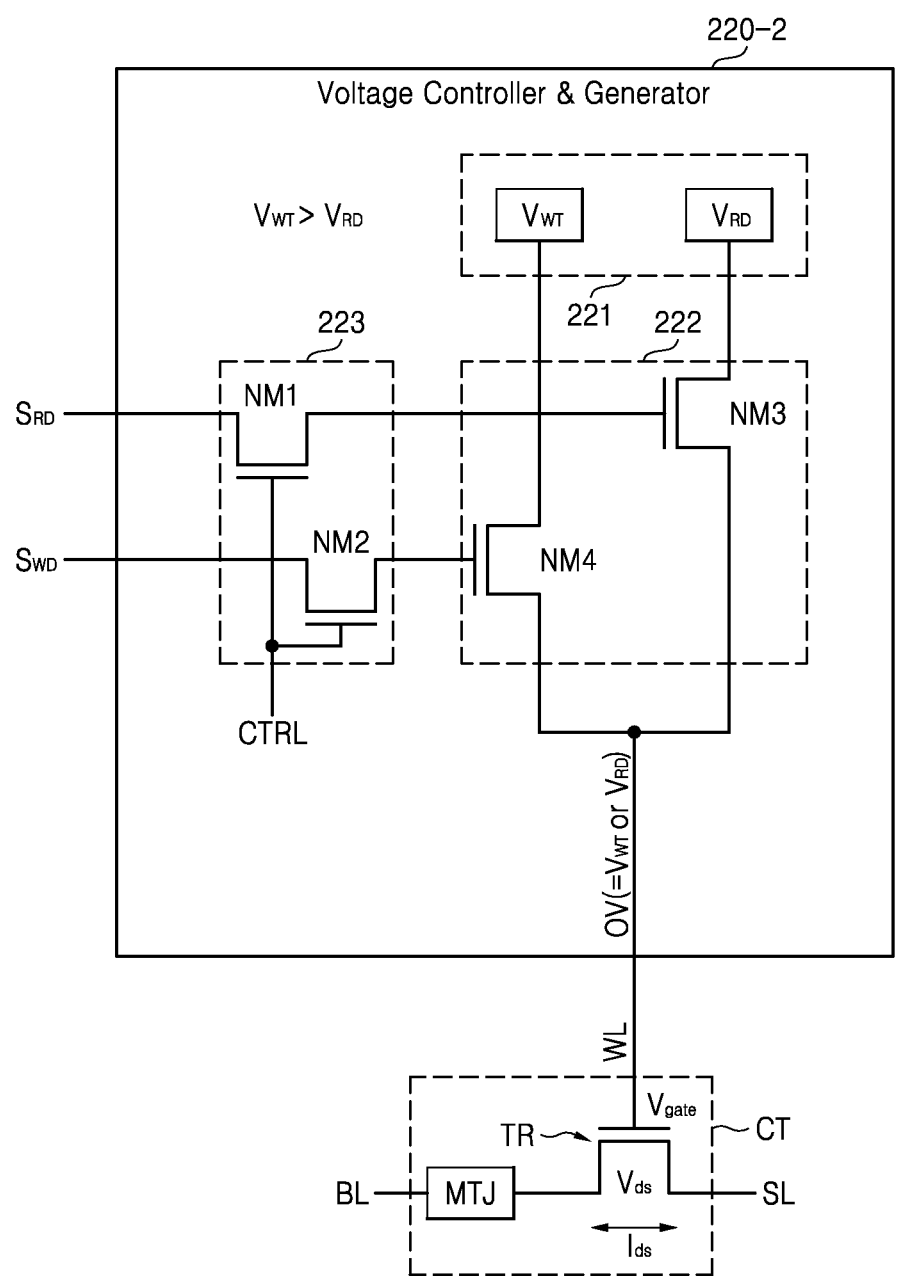
FIG. 5 is a circuit diagram illustrating a voltage controller and generator according to another embodiment of the inventive concept.

FIG. 5 is a circuit diagram illustrating a voltage controller and generator according to another embodiment of the inventive concept. The illustrated voltage controller and generator could be used in control and voltage generation unit 210, for example.

Referring to FIG. 5, a voltage controller and generator 220-2 comprises a reference voltage generator 221, a voltage selection unit 222, and a voltage selection control unit 223.

Reference voltage generator 221 generates a second reference voltage VWT and a first reference voltage VRD. Second reference voltage VWT is higher than first reference voltage VRD. Voltage selection unit 222 applies one of second reference voltage VWT and first reference voltage VRD to a gate of a cell transistor TR of an MRAM cell CT through a word line WL.

Voltage controller and generator 220-2 receives a first decoding signal SRD or a second decoding signal SWD from command decoder 210, and is controlled to turn on or off based on a control signal CTRL.

MRAM cell CT is connected to a word line WL, a bit line BL, and a source line SL. A magnetic tunnel junction (MTJ) is connected between a drain of a cell transistor TR and bit line BL.

A cell current Ids flowing through cell transistor TR is determined based on an operating voltage OV provided from voltage controller and generator 220-2. For example, where a voltage Vgate provided to a gate of cell transistor TR is the second reference voltage (OV=VWT), more cell current Ids flows in the cell transistor compared to where the first reference voltage (OV=VRD) is provided to the gate. This is because second reference voltage VWT is higher than first reference voltage VRD.

When reading data of MRAM cell CT, first decoding signal SRD is provided to an NMOS transistor NM3 through an NMOS transistor NM1 turned on based on a control signal CTRL, and accordingly first reference voltage VRD is provided to a gate of cell transistor TR through an NMOS transistor NM3 which is turned on.

When writing data in MRAM cell CT, second decoding signal SWD is provided to an NMOS transistor NM4 through an NMOS transistor NM2 turned on based on a control signal CTRL, and accordingly NMOS transistor NM4 is turned on and second reference voltage VWT is provided to a gate of cell transistor TR.

A threshold voltage of cell transistor TR becomes Vds. Cell transistor TR is turned on by the provided second reference voltage VWT and data apparent on a bit line BL is stored in the MTJ.

In a write operation, second reference voltage VWT, which is higher than first reference voltage VRD used in a read operation, is provided to a gate of cell transistor TR, so that more current flows in the cell transistor during a write operation than during a read operation, and accordingly data may be written in the MTJ faster.

FIG. 6 is a timing diagram illustrating the operation of a voltage controller and generator according to an embodiment of the inventive concept.

Referring to FIGS. 2-6, semiconductor device 200A or 200' receives a read command READ or a write command WRITE from a controller 100A. First decoding signal SRD is generated in response to read command READ, and first reference voltage VRD synchronized with first decoding signal SRD is provided to a gate of cell transistor TR through a word line WL. Thereafter, second decoding signal SWD is generated in response to write command WRITE, and second reference voltage VWT synchronized with second decoding signal SWD is provided to a gate of cell transistor TR through word line WL. Finally, an operating voltage OV(=VRD) or OV(=VWT) is provided to MRAM cell array 230A or RRAM cell array 230', e.g., a memory core, in response to read command READ or write command WRITE.

Figure 7A:
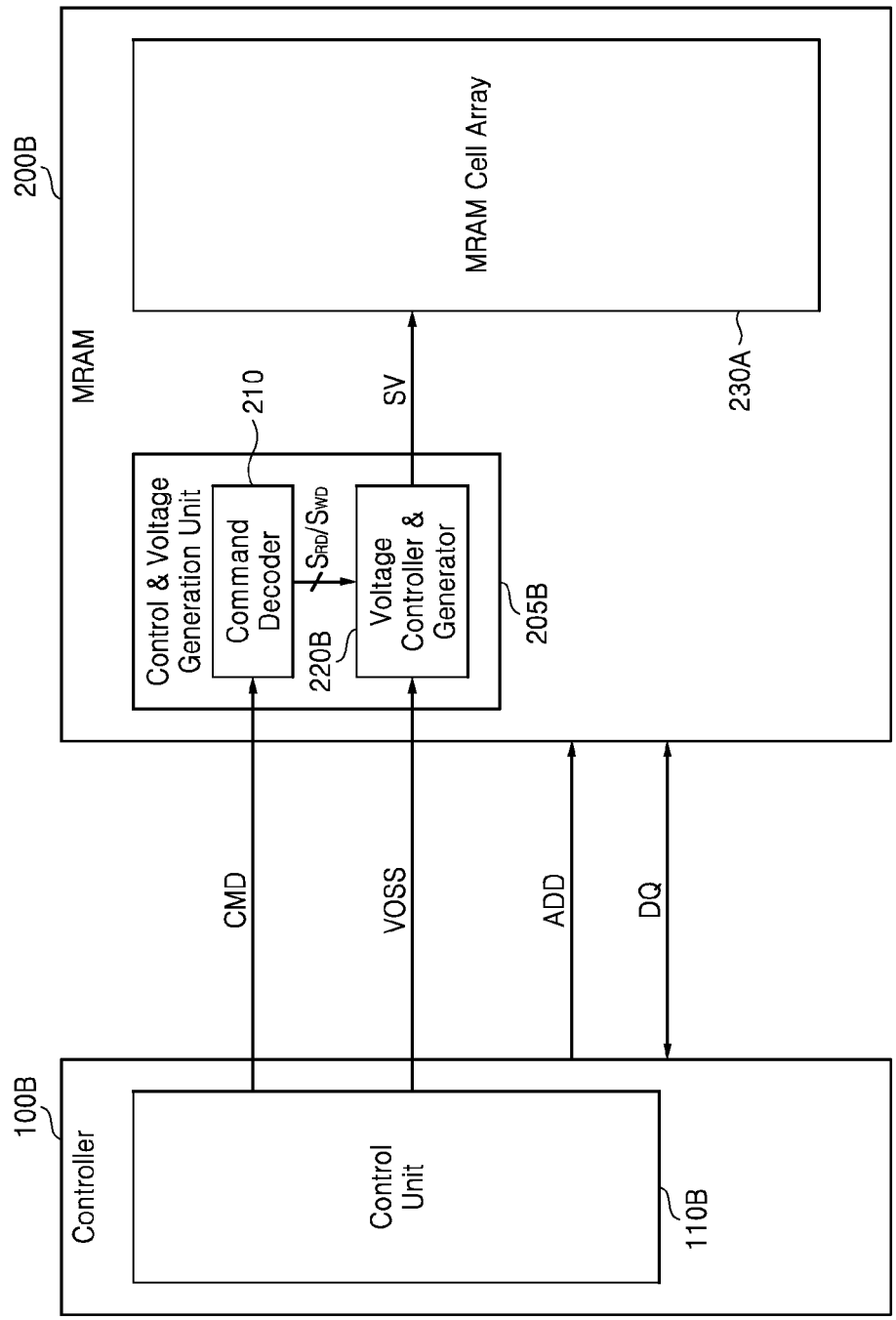
FIG. 7A is a block diagram illustrating a memory system according to an embodiment of the inventive concept.

FIG. 7A is a block diagram illustrating a memory system according to an embodiment of the inventive concept.

Referring to FIG. 7A, a controller 100B comprises a control unit 110B. Control unit 110B transmits a command CMD, a voltage selection signal VOSS, an address ADD, and data DQ to an MRAM 200B.

MRAM 200B comprises an MRAM cell array 230A and a control and voltage generation unit 205B. Command decoder 210 receives a write command, a read command, or other commands output from control unit 110B, and generates second decoding signal SWD or first decoding signal SRD in response to the received command.

Voltage controller and generator 220B of control and voltage generation unit 205B generates a selection voltage SV based on a voltage selection signal VOSS output from control unit 110B and a decoding signal SRD or SWD output from command decoder 210, and provides the generated selection voltage SV for MRAM cell array 230A. Selection voltage SV is generated in response to second decoding signal SWD or first decoding signal SRD, and may be generated in response to voltage selection signal VOSS only.

Figure 7B:
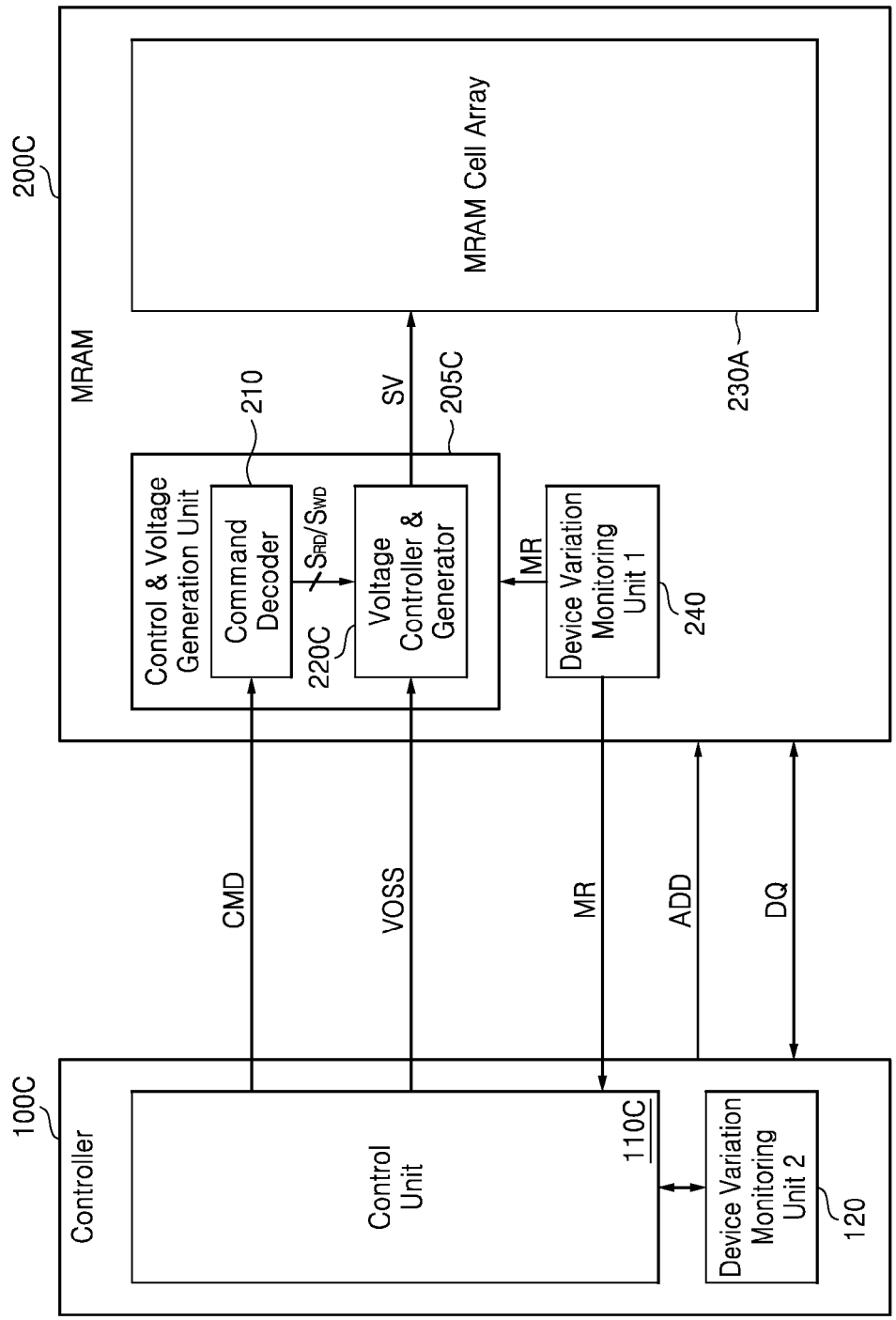
FIG. 7B is a block diagram illustrating a memory system according to another embodiment of the inventive concept.

FIG. 7B is a block diagram illustrating a memory system according to another embodiment of the inventive concept. The memory system of FIG. 7B is similar to the memory system of FIG. 7A, except that it further comprises a first device variation monitoring unit 1 as indicated by reference numeral 240 and a second device variation monitoring unit 2 as indicated by reference numeral 120.

Referring to FIG. 7B, second device variation monitoring unit 2 120 is incorporated in a controller 100C. Second device variation monitoring unit 2 120 monitors information on temperature variation, process variation, and/or voltage variation of controller 100C, and transmits a monitoring result to control unit 110C. Control unit 110C transmits voltage selection signal VOSS and a command such as the write command or the read command according to the monitoring result.

An MRAM 200C further comprises a first device variation monitoring unit 1 240 differently from MRAM 200B of FIG. 7A. First device variation monitoring unit 1 240 monitors information on temperature variation, process variation, voltage variation, and/or resistance variation of the MRAM cell, and transmits a monitoring result MR to controller 100C or control and voltage generation unit 205C. A selection voltage SV for an operation of an MRAM cell in MRAM 200C may be selected according to monitoring result MR.

Controller 100C receives monitoring result MR from MRAM 200C, and second device variation monitoring unit 2 120 receives and stores monitoring result MR. The stored monitoring result may be used to adjust operating voltage OV according to different operating conditions of MRAM 200C.

FIGS. 8A-8E are block diagrams illustrating various examples of first device variation monitoring unit 1 240 illustrated in FIG. 7B, according to different embodiments of the inventive concept.

Figure 8A:
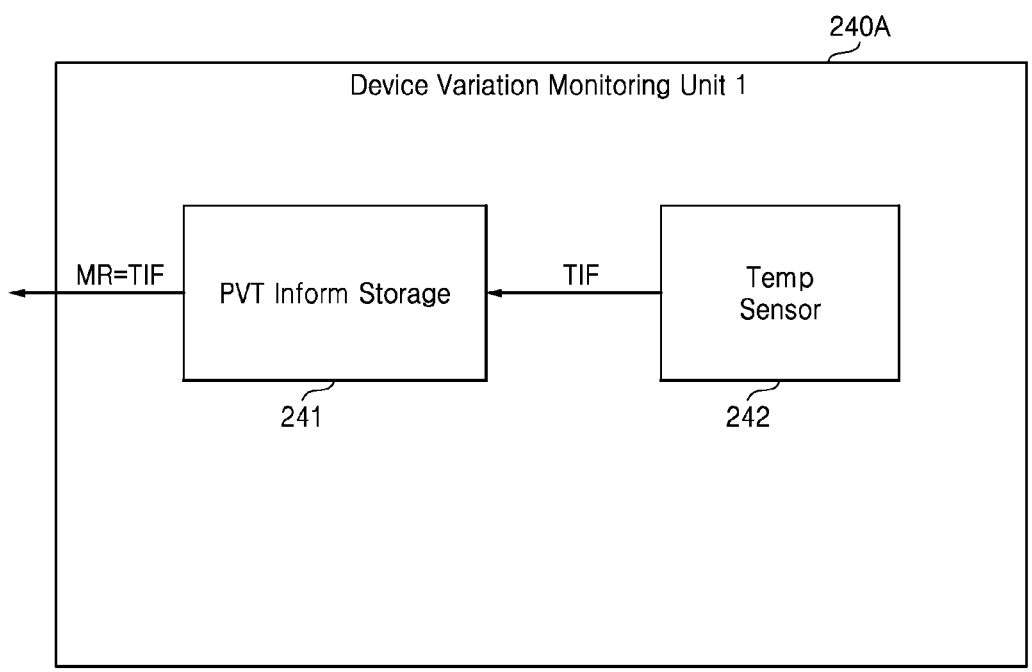
FIG. 8A is a block diagram of a first device variation monitoring unit illustrated in FIG. 7B, according to an embodiment of the inventive concept.

Referring to FIGS. 7B and 8A, a first device variation monitoring unit 1 240A comprises a process, voltage, temperature (PVT) information storage device 241 and a temperature sensor 242. Temperature sensor 242 senses internal temperature of MRAM 200C during an operation or temperature of MRAM 200C according to variation in external surroundings, and stores a sensing result, i.e., temperature information TIF in PVT information storage device 241.

PVT information storage device 241 receives and stores temperature information TIF from temperature sensor 242, and transmits temperature information TIF to controller 100C or control and voltage generation unit 205C as monitoring result MR in real-time or on-the fly. Temperature information TIF may be generated by an analog-to-digital converter inside temperature sensor 242.

Figure 8B:
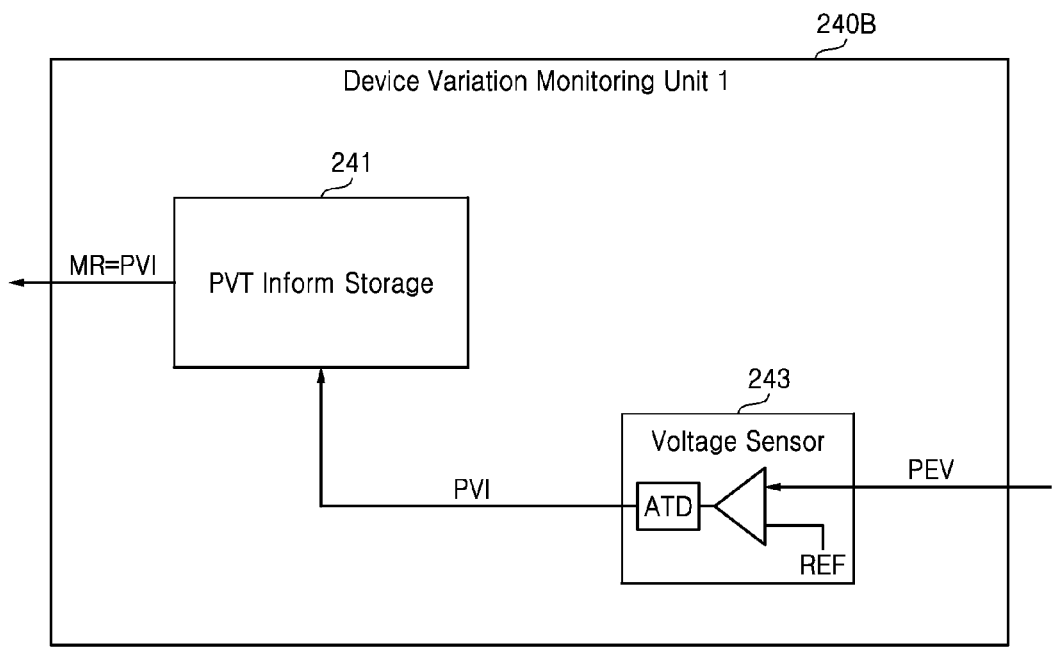
FIG. 8B is a block diagram of the first device variation monitoring unit illustrated in FIG. 7B, according to another embodiment of the inventive concept.

Referring to FIGS. 7B and 8B, a first device variation monitoring unit 1 240B comprises PVT information storage device 241 and a voltage sensor 243.

Voltage sensor 243 receives a current voltage PEV of inside MRAM 200C, e.g., an MRAM cell, compares current voltage PEV and a reference voltage REF each other, and transmits a result of the comparison to PVT information storage device 241 as current voltage information PVI through an analog to digital (ATD) converter.

PVT information storage device 241 receives and stores current voltage information PVI, and then transmits current voltage information PVI to controller 100C or control and voltage generation unit 205C as monitoring result MR in real time.

Figure 8C:
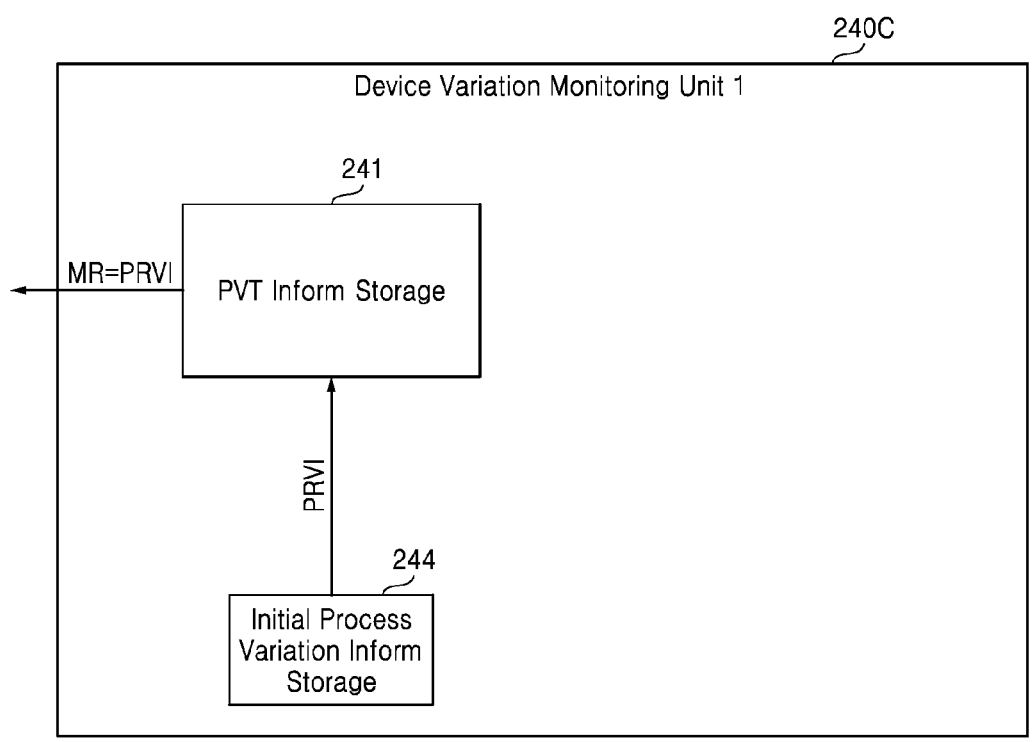
FIG. 8C is a block diagram of the first device variation monitoring unit illustrated in FIG. 7B, according to another embodiment of the inventive concept.

Referring to FIGS. 7B and 8C, a first device variation monitoring unit 1 240C comprises PVT information storage device 241 and an initial process variation information storage device 244.

Initial process variation information storage device 244 stores process variation information on a process state of MRAM 200C after manufacture, and transmits the stored process variation information PRVI to PVT information storage device 241. For example, a resistance value of an MRAM cell, an average resistance value of an MRAM cell by block, and a correction (or compensation) value for an optimal operating voltage through a test may be stored in initial process variation information storage device 244.

Where an operating voltage OV or a selection voltage SV of MRAM 200C is 1.2V, information on a correction value, i.e., 1.3V or 1.1V, for operating voltage OV or selection voltage SV of 1.2V may be stored in initial process variation information storage device 244, considering an error during manufacture of MRAM 200C.

PVT information storage device 241 receives and stores initial process variation information PRVI, and then transmits the initial process variation information PRVI to controller 100C or control and voltage generation unit 205C as monitoring result MR in real time.

Figure 8D:
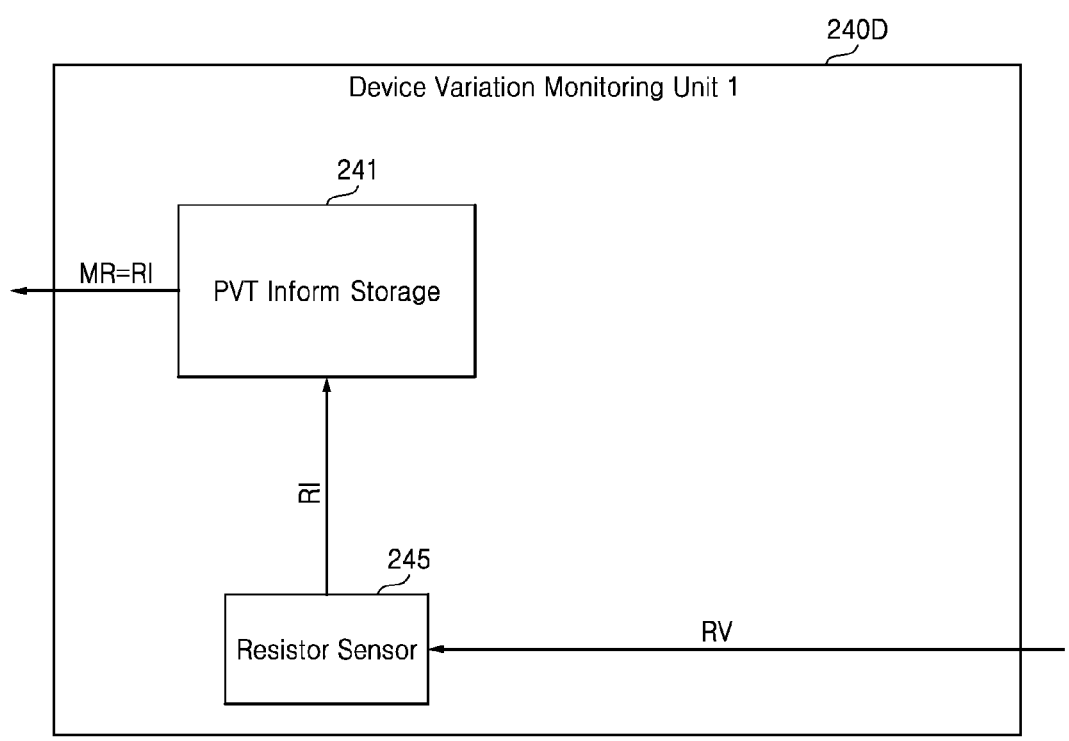
FIG. 8D is a block diagram of the first device variation monitoring unit illustrated in FIG. 7B, according to another embodiment of the inventive concept.

Referring to FIGS. 7B and 8D, a first device variation monitoring unit 1 240D comprises PVT information storage device 241 and a resistance sensor 245.

Resistance sensor 245 senses a resistance value RV of an MTJ in an MRAM cell of MRAM 200C, generates resistance information RI according to the sensing result, and transmits resistance information RI to PVT information storage device 241. Resistance information RI is transmitted to controller 100C or control and voltage generation unit 205C as monitoring result MR in real time. Resistance information RI can be generated by an analog-to-digital converter inside resistance sensor 245.

Figure 8E:
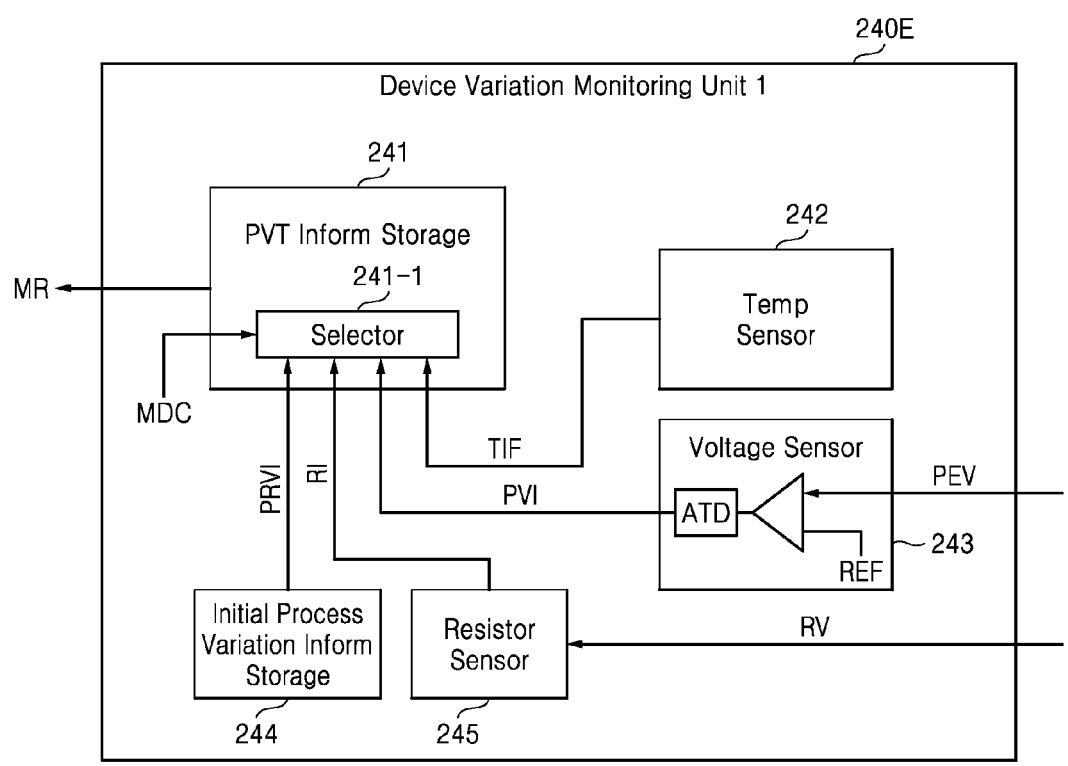
FIG. 8E is a block diagram of the first device variation monitoring unit illustrated in FIG. 7B, according to another embodiment of the inventive concept.

Referring to FIGS. 7B and 8E, a first device variation monitoring unit 1 240E comprises a PVT information storage device 241, a temperature sensor 242, a voltage sensor 243, an initial process variation information storage device 244, a resistance sensor 245.

Corresponding information TIF, PVI, PRVI, and/or RI is transmitted to PVT information storage device 241, and a selector 241-1 selects one of information TIF, PVI, PRVI, and/or RI based on a mode control signal MDC. For example, where a mode control signal MDC indicates a power saving mode, selector 241-1 may not select any of the information.

As illustrated in FIGS. 8A to 8D, at least one of temperature sensor 242, voltage sensor 243, initial process variation information storage device 244, and resistance sensor 245 may be embodied in first device variation monitoring unit 1 240. For example, first device variation monitoring unit 1 240 may include voltage sensor 243 and resistance sensor 245 only.

FIG. 9A is a table illustrating values of a 2-bit voltage selection signal and a voltage level according to an embodiment of the inventive concept, and FIG. 9B is another table illustrating values of a 3-bit voltage selection signal and a voltage level according to an embodiment of the inventive concept.

Referring to FIG. 9A, Table 1 illustrates voltage selection signal VOSS and a voltage level in FIG. 7A or 7B. Controller 100B or 100C transmits a two-bit voltage selection signals VOSS to MRAM 200B or 200C.

Where the received voltage selection signals VOSS is 11, 10, 01, or 00, voltage controller and generator 220B or 220C selects 2.5V, 2.0V, 1.5V, or 1.0V as a voltage level SV or OV corresponding to the received two-bit voltage selection signals VOSS.

Referring to FIG. 9B, Table 2 illustrates a voltage selection signal VOSS and a voltage level in FIG. 7A or 7B. Controller 100B or 100C transmits a three-bit voltage selection signals VOSS to MRAM 200B or 200C.

Where the received voltage selection signals VOSS are 000, 001, . . . , 110, or 111, the voltage controller and generator 220B or 220C may select one of 1.0V, 1.5V, . . . , 4.0V, and 4.5V, or one of 1.0V, 2.0V, . . . , 7.0V, and 8.0V as a voltage level SV or OV corresponding to the three-bit voltage selection signals VOSS.

For example, voltage controller and generator 220B or 220C may select a selection voltage SV or an operating voltage OV referring to voltage selection signals VOSS and/or monitoring result MR generated by the first device variation monitoring unit 240.

Figure 9C:
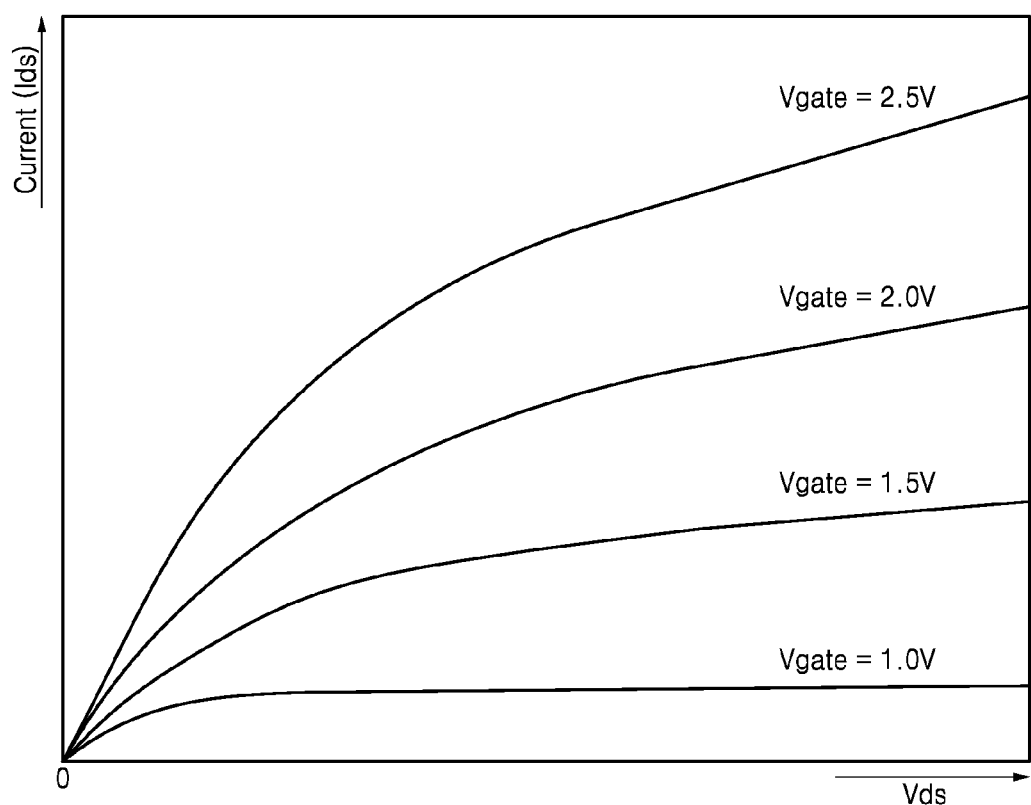
FIG. 9C is a graph illustrating cell current as a function of cell voltage for different values of a gate voltage, according to an embodiment of the inventive concept.

FIG. 9C is a graph illustrating cell current as a function of cell voltage for different values of a gate voltage, according to an embodiment of the inventive concept. It will be assumed that the illustrated voltages relate to a cell transistor of an MRAM cell in FIG. 5. Accordingly, based on a gate voltage Vgate applied to a gate of cell transistor TR of MRAM cell CT, FIG. 9C illustrates a relationship between a voltage Vds applied to cell transistor TR and a current Ids flowing in a source and a drain of MRAM cell CT.

Referring to FIG. 9C, as voltage Vgate provided to a gate of cell transistor TR of MRAM cell CT increases, an amount of current Ids flowing in MRAM cell CT increases. For example, when writing data in MRAM cell CT, a write speed increases as a gate voltage Vgate applied to a word line increases.

Figure 10:
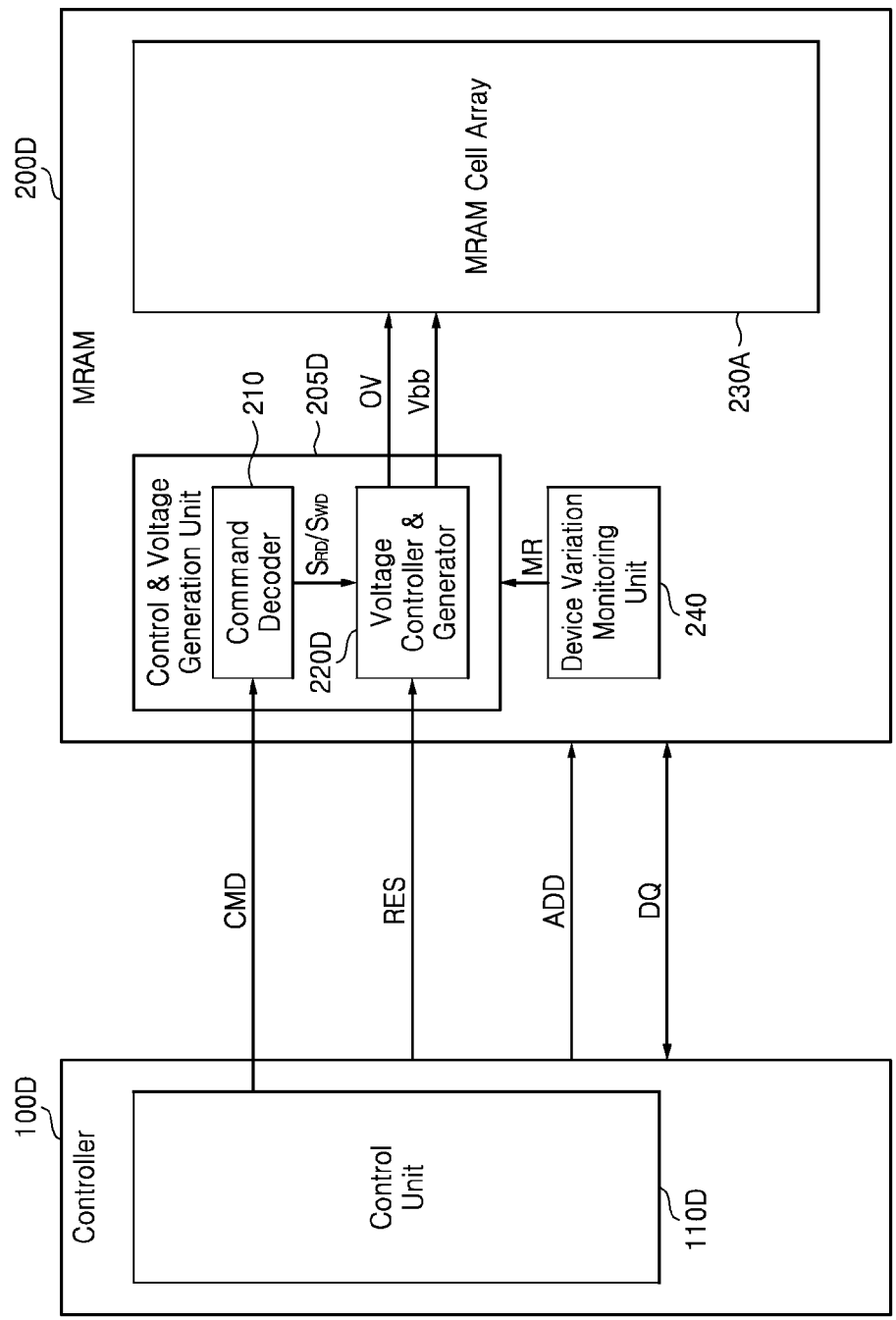
FIG. 10 is a block diagram illustrating a memory system comprising an MRAM receiving a back bias voltage according to an embodiment of the inventive concept.

FIG. 10 is a block diagram illustrating a memory system comprising an MRAM receiving a back bias voltage according to an embodiment of the inventive concept.

Referring to FIG. 10, a controller 100D comprises a control unit 110D, which transmits a command CMD, a reset signal RES, and an address ADD, and transmits and receives data DQ. The control signals comprises a command CMD and a reset signal RES.

MRAM 200D comprises an MRAM cell array 230A comprising multiple MRAM cells, a control and voltage generation unit 205D, and first device variation monitoring unit 240.

Voltage controller and generator 220D in control and voltage generation unit 205D generates a back bias signal Vbb in response to a reset signal RES included in the control signal. According to some embodiments, back bias signal Vbb is generated based on a second decoding signal SWD or a first decoding signal SRD generated by command decoder 210. That is, back bias signal Vbb may be generated based on reset signal RES and/or decoding signal SWD or SRD.

Figure 11A:
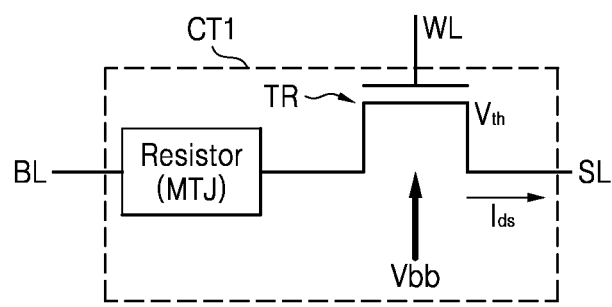
FIG. 11A is a circuit diagram illustrating a method for providing a back bias voltage to a cell transistor, according to an embodiment of the inventive concept.
Figure 11B:
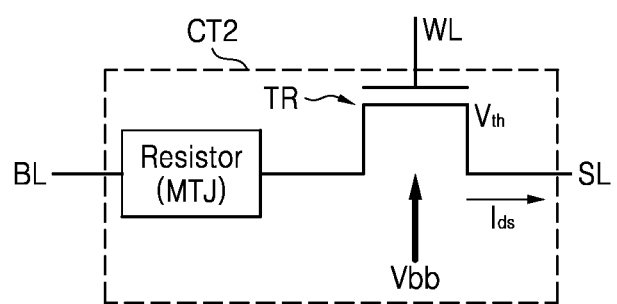
FIG. 11B is a circuit diagram illustrating a method for providing a back bias voltage to a cell transistor, according to an embodiment of the inventive concept.
Figure 11C:
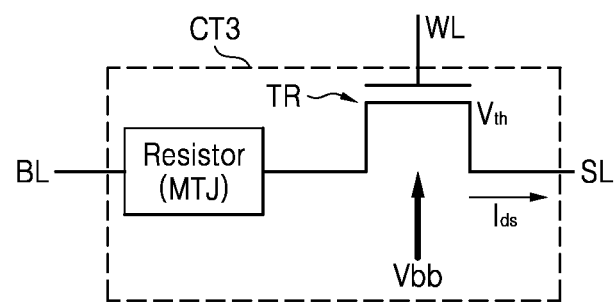
FIG. 11C is a circuit diagram illustrating a method for providing a back bias voltage to a cell transistor, according to an embodiment of the inventive concept.

FIGS. 11A-11C are circuit diagrams illustrating methods for providing a back bias voltage to a cell transistor, according to various embodiments of the inventive concept.

Referring to FIG. 11A, an MRAM cell CT1 is connected to a bit line BL, a word line WL, and a source line SL, and the resistor (MTJ) which is a memory element connected between bit line BL and a drain of cell transistor TR.

Where an operating voltage OV is provided to a word line WL, a cell current Ids starts to flow in through a channel of cell transistor TR. A negative back bias voltage Vbb is provided to cell transistor TR in response to a reset signal RES and/or a command, e.g., a read command or a write command, for starting an operation of MRAM cell CT1.

Operating voltage OV provided to word line WL and/or the negative back bias voltage Vbb provided to cell transistor TR determines a threshold voltage Vth of MRAM cell CT1. For example, where the negative back bias voltage Vbb is provided to cell transistor TR, a leakage current occurring in cell transistor TR may decrease, and threshold voltage Vth may increase accordingly.

Referring to FIG. 11B, control and voltage generation unit 205D provides cell transistor TR with a positive back bias voltage Vbb only when a write command CMD is output from controller 100D. For example, when the positive back bias voltage Vbb increases, threshold voltage Vth of cell transistor TR decreases and a cell current Ids increases.

Referring to FIG. 11C, according to temperature, an operating voltage, and/or an initial process state of MRAM 200D, various back bias voltages Vbb may be provided to cell transistor TR. For example, as temperature of the surroundings of MRAM 200D increases or decreases, back bias voltage Vbb may be variously adjusted.

Figure 12A:
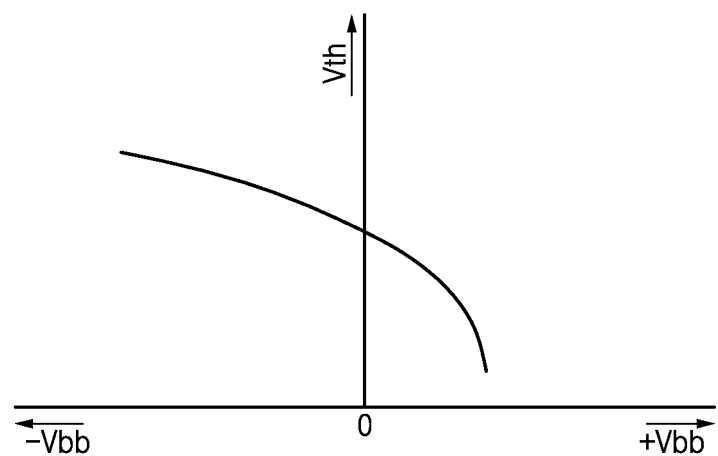
FIG. 12A is a voltage diagram illustrating a threshold voltage as a function of a back bias voltage, according to an embodiment of the inventive concept.

FIG. 12A is a voltage diagram illustrating a threshold voltage as a function of a back bias voltage, according to an embodiment of the inventive concept.

Referring to FIGS. 11A to 11C, and 12A, as back bias voltage Vbb varies from negative −Vbb to positive +Vbb, threshold voltage Vth of cell transistor TR varies. Where the positive back bias voltage Vbb starts to be provided to cell transistor TR, threshold voltage Vth dramatically decreases.

Figure 12B:
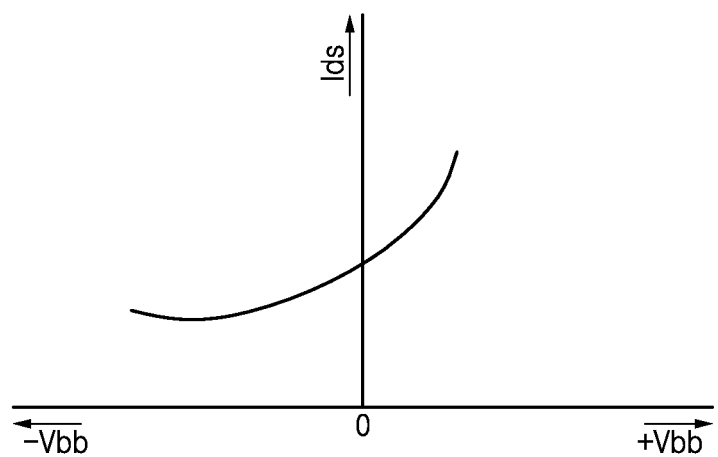
FIG. 12B is a voltage diagram illustrating a cell current as a function of a back bias voltage, according to an embodiment of the inventive concept.

FIG. 12B is a voltage diagram illustrating a cell current as a function of a back bias voltage, according to an embodiment of the inventive concept.

Referring to FIGS. 11A-11C and 12B, as back bias voltage Vbb varies from negative −Vbb to positive +Vbb, a cell current Ids flowing in a cell transistor TR varies. Where the positive back bias voltage Vbb starts to be provided to cell transistor TR, cell current Ids dramatically increases.

Figure 13:
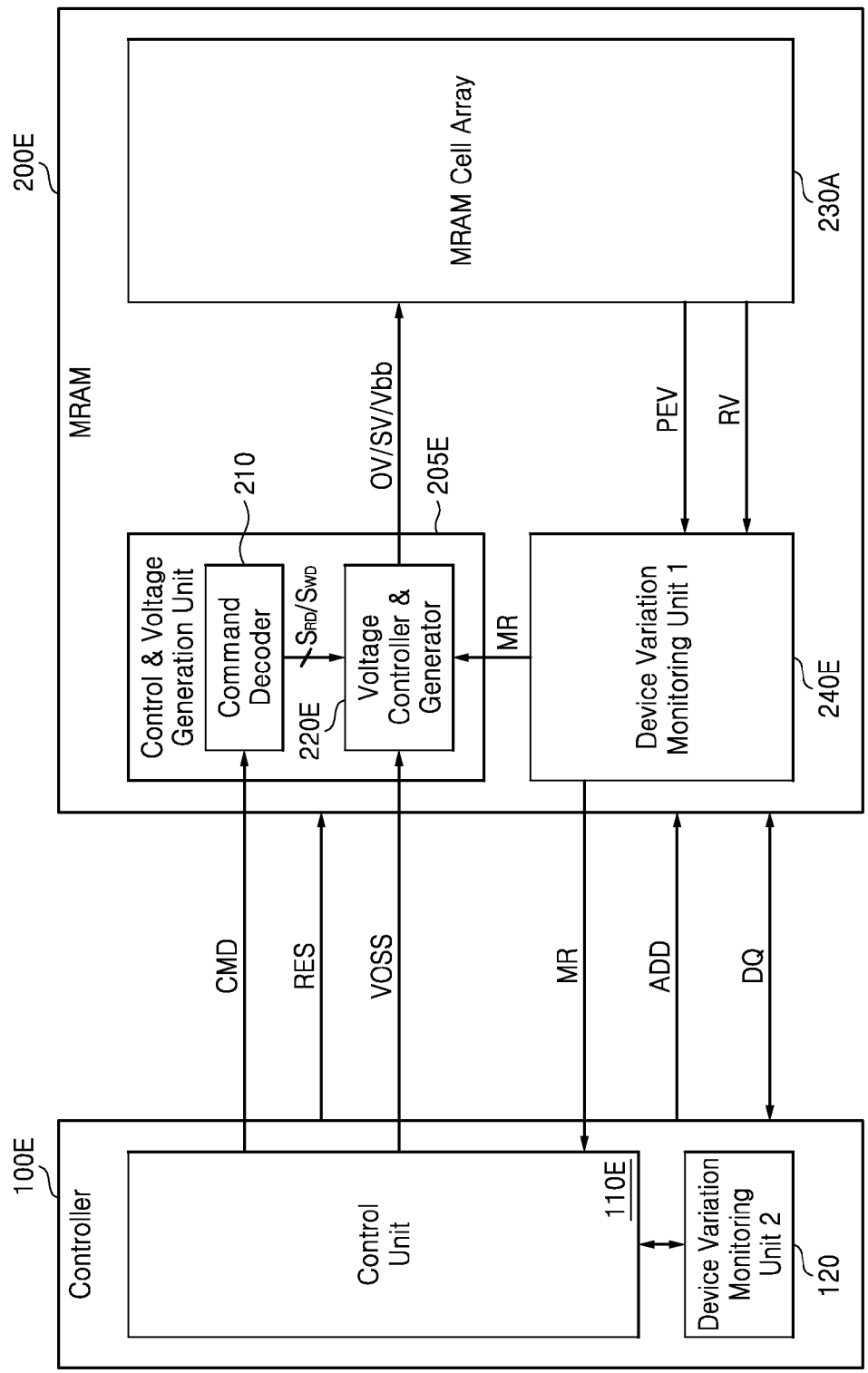
FIG. 13 is a block diagram illustrating a memory system according to another embodiment of the inventive concept.

FIG. 13 is a block diagram illustrating a memory system according to another embodiment of the inventive concept.

Referring to FIGS. 8E and 13, a controller 100E comprises a control unit 110E and a second device variation monitoring unit 2 120.

MRAM 200E comprises an MRAM cell array 230A, a control and voltage generation unit 205E, and a first device variation monitoring unit 1 240E. Controller 100E transmits a command CMD, a reset signal RES, a voltage selection signal VOSS, an address ADD, and data DQ to MRAM 200E.

Control and voltage generation unit 205E comprises a command decoder 210 and a voltage controller and generator 220E. Command decoder 210 generates a second decoding signal SWD or a first decoding signal SRD in response to a command CMD, and transmits the generated decoding signal SWD or SRD to voltage controller and generator 220E.

Finally, control and voltage generation unit 205E generates an operating voltage OV in response to a command, e.g., a read command or a write command, and/or a voltage selection signal VOSS.

Operating voltage OV may be, for instance, a selection voltage SV or a back bias voltage Vbb. In various alternative embodiments, operating voltage OV, selection voltage SV, and back bias voltage Vbb may have the same level or a different level from each other. Additionally, in various alternative embodiments, at least one operating voltage may be provided to at least one MRAM cell in parallel through voltage controller and generator 220E having multiple power lines.

According to configuration of MRAM cell array 230A, operating voltage OV may be provided equally for the entire of MRAM cell array 230A, and may be partially applied by bank, block, or segment.

First device variation monitoring unit 1 240E comprises a PVT information storage device 241, a temperature sensor 242, a voltage sensor 243, an initial process variation information storage device 244, and a resistance sensor 245. In various alternative embodiments, first device variation monitoring unit 1 240E may be embodied in one of first device variation monitoring unit 1 240A to 240D described by referring to FIGS. 8A to 8D.

Figure 14:
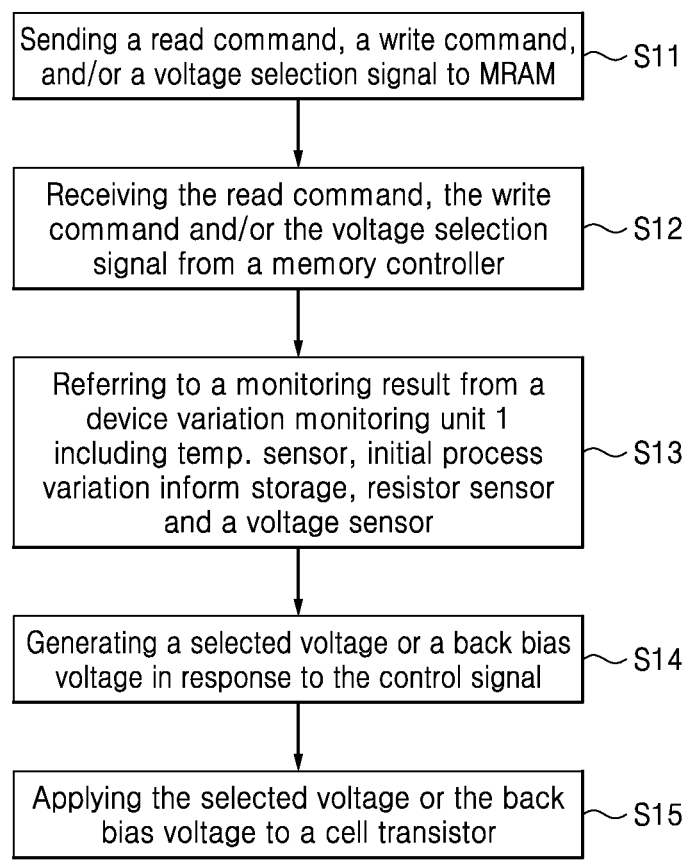
FIG. 14 is a flowchart illustrating a method of operating a memory system according to an embodiment of the inventive concept.

FIG. 14 is a flowchart illustrating a method of operating a memory system according to an embodiment of the inventive concept.

Referring to FIGS. 1 to 14, a controller 100 (e.g., 100A, 100B, 100C, 100D, or 100E) transmits a command, e.g., a read command or a write command, and/or a voltage selection signal VOSS to the MRAM 200 (e.g., 200A, 200B, 200C, 200D, or 200E) (S11). MRAM 200 receives the command, e.g., a read command or a write command, and/or voltage selection signal VOSS (S12). A monitoring result MR generated from first device variation monitoring unit 1 240 (e.g., 240A, 240B, 240C, 240D, or 240E) comprising at least one of temperature sensor 242, voltage sensor 243, initial process variation information storage device 244, and resistance sensor 245 is referred to for generating an operating voltage OV of an MRAM cell CT (e.g., CT1, CT2, or CT3) (S13). A selection voltage SV or a back bias voltage Vbb is generated as an operating voltage OV in response to a control signal CS output from the controller 100 (S14). Selection voltage SV or back bias voltage Vbb is provided to each cell transistor TR of multiple MRAM cells CT included in MRAM cell array 230A (S15).

Figure 15:
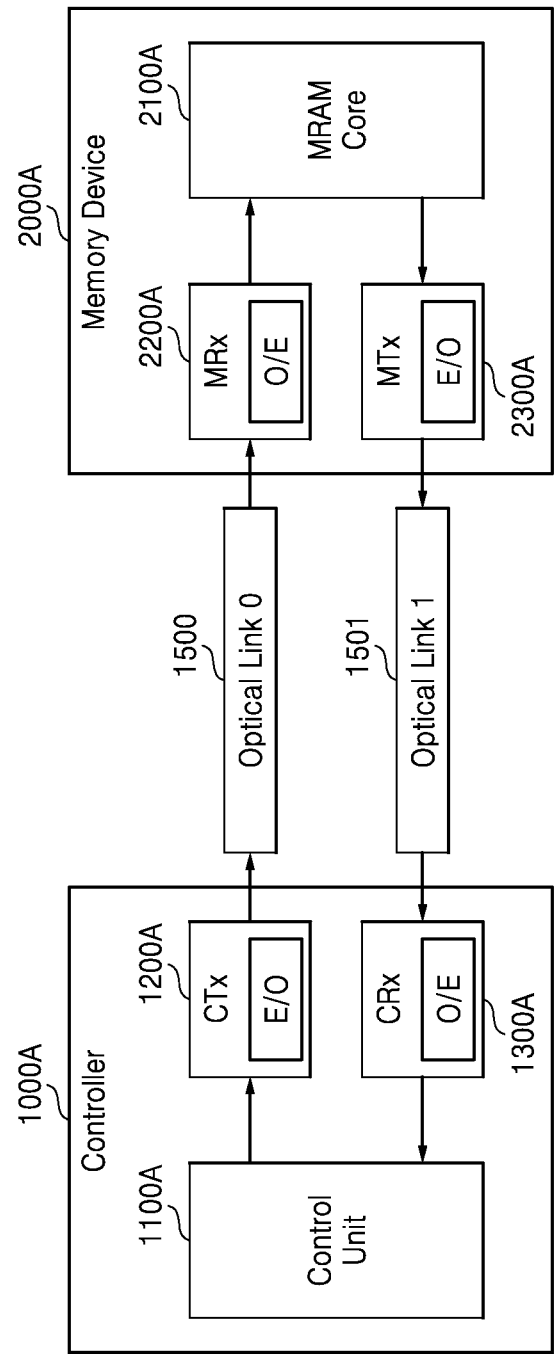
FIG. 15 is a block drawing illustrating a memory system comprising optical links, according to an embodiment of the inventive concept.

FIG. 15 is a block drawing illustrating a memory system comprising optical links, according to an embodiment of the inventive concept.

Referring to FIG. 15, the memory system comprises a controller 1000A and a memory device 2000A. Except for an optical transmitter CTx 1200A and an optical receiver CRx 1300A, a structure and a function of controller 100 are substantially the same as a structure and a function of controller 1000A.

Controller 1000A comprises control unit 1100A, optical transmitter CTx 1200A comprising an electrical-to-optical (E/O) conversion device converting an electrical signal into an optical signal, and optical receiver CRx 1300A comprising an optical-to-electrical (O/E) conversion device converting an optical signal into an electrical signal.

Memory device 2000A comprises an MRAM core 2100A, an optical receiver MRx 2200A comprising an optical-to-electrical (O/E) conversion device converting an optical signal into an electrical signal, and an optical transmitter MTx 2300A comprising an electrical-to-optical (E/O) conversion device converting an electrical signal into an optical signal. A structure and operation of memory device 2000A are substantially the same as those of MRAM 200 described with reference to FIGS. 1-14.

Between controller 1000A and memory device 2000A, a first optical link 1500 and a second optical link 1501 for transmitting and receiving data are connected to each other. In certain alternative embodiments, controller 1000A and memory device 2000A may transmit and receive data through a single optical link.

Figure 16A:
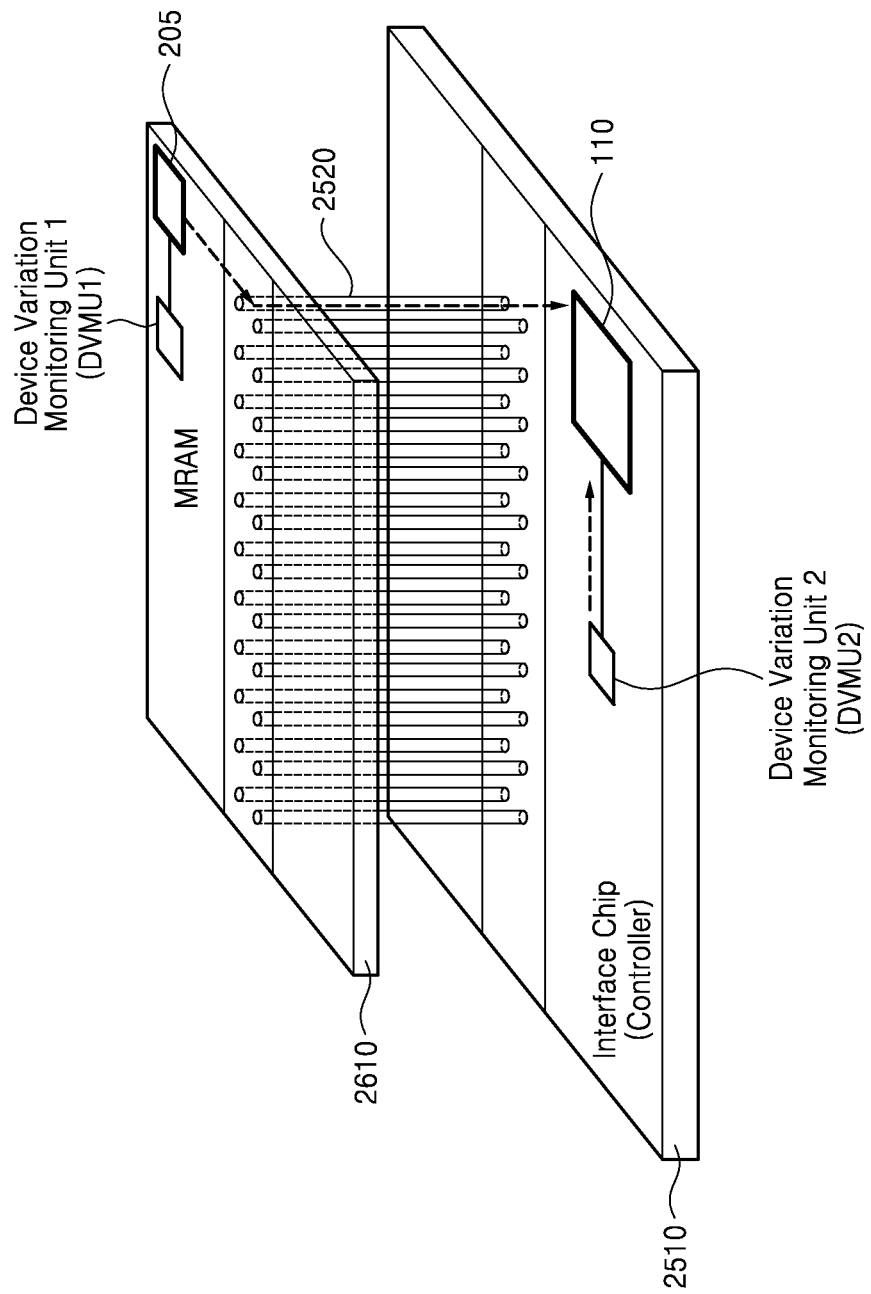
FIG. 16A is a schematic diagram illustrating a memory system comprising stacked through through-silicon vias (TSVs), according to an embodiment of the inventive concept.

FIG. 16A is a schematic diagram illustrating a memory system comprising stacked TSVs, according to an embodiment of the inventive concept.

Referring to FIG. 16A, an interface chip 2510 comprising control unit 110 is positioned at a lowest layer, and an MRAM chip 2610 comprising MRAM 200 is disposed thereon. Interface chip 2510 comprises a control unit 110 (e.g., 110A, 110B, 110C, 110D, or 110E), and a second device variation monitoring unit 2 (DVMU2).

MRAM chip 2610 comprises a control and voltage generation unit 205 (e.g., 205A, 205B, 205C, 205D, or 205E), and a first device variation monitoring unit 1 (DVMU1). A monitoring result generated from the device variation monitoring unit 1 DVMU1 or device variation monitoring unit 2 DVMU2 is delivered to a corresponding interface chip 2510 or MRAM 2610 through connection means 2520, e.g., through silicon vias (TSVs) and bumps. For example, the number of stacked chips may be one or more. TSVs are an example of vertical electrical connections.

Figure 16B:
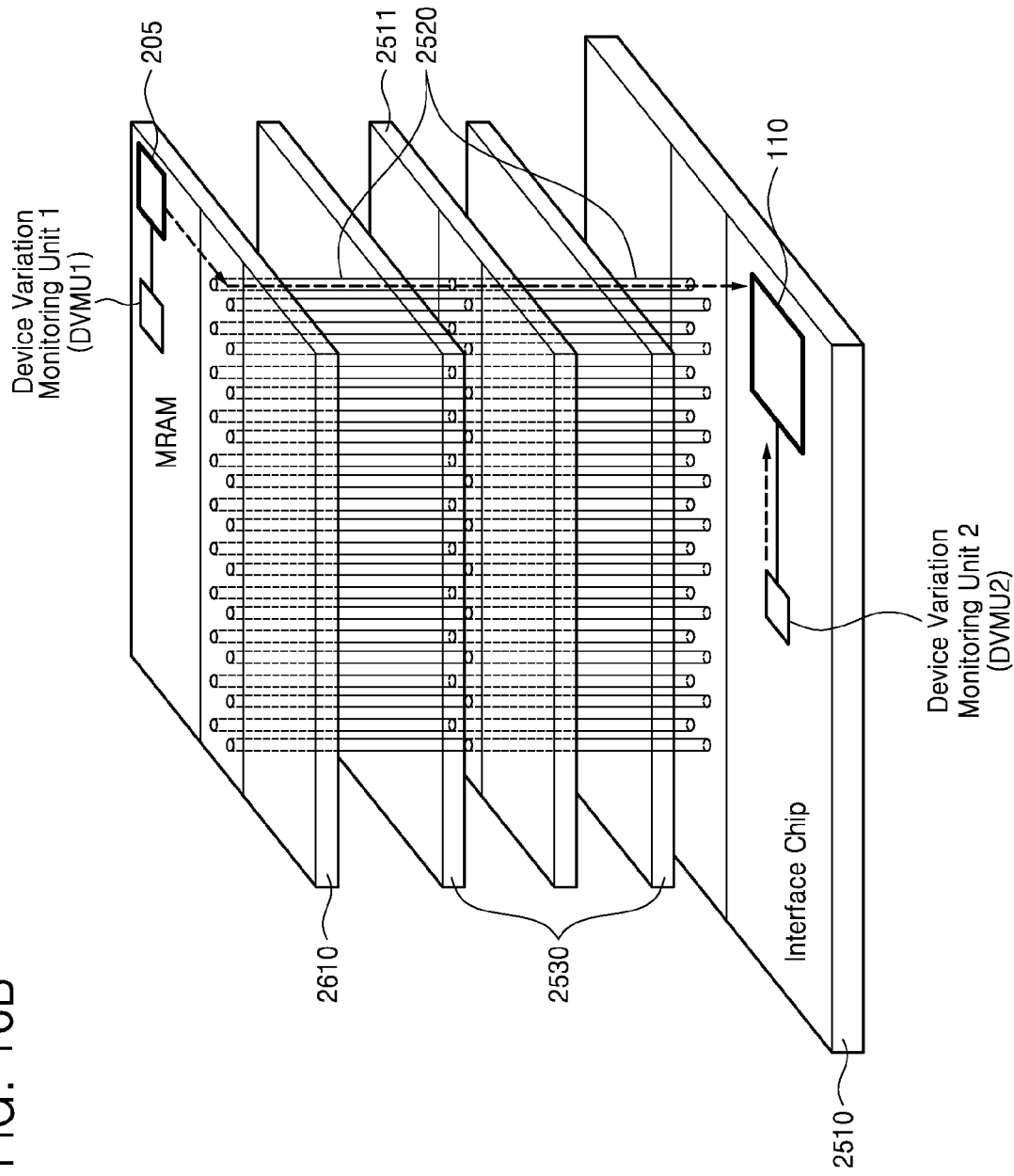
FIG. 16B is a schematic diagram illustrating a memory system comprising stacked TSVs, according to another embodiment of the inventive concept.

FIG. 16B is a schematic diagram illustrating a memory system comprising stacked TSVs, according to another embodiment of the inventive concept.

Referring to FIG. 16B, each magnetic field protection layer 2530 is positioned between two corresponding chips 2510 and 2511, and 2511 and 2610. Each magnetic field protection layer 2530 blocks a magnetic field occurring between two corresponding chips 2510 and 2511, and 2511 and 2610 according to a supply of an operating voltage OV.

Accordingly, because each of MRAM chips 2511 and 2610 may operate in a more stable way, data errors may be prevented from occurring in an MRAM cell included in each of MRAM chips 2511 and 2610. In addition, each magnetic field protection layer 2530 may reduce variation in an operating voltage based on a monitoring result which is generated and transmitted in real time.

Figure 16C:
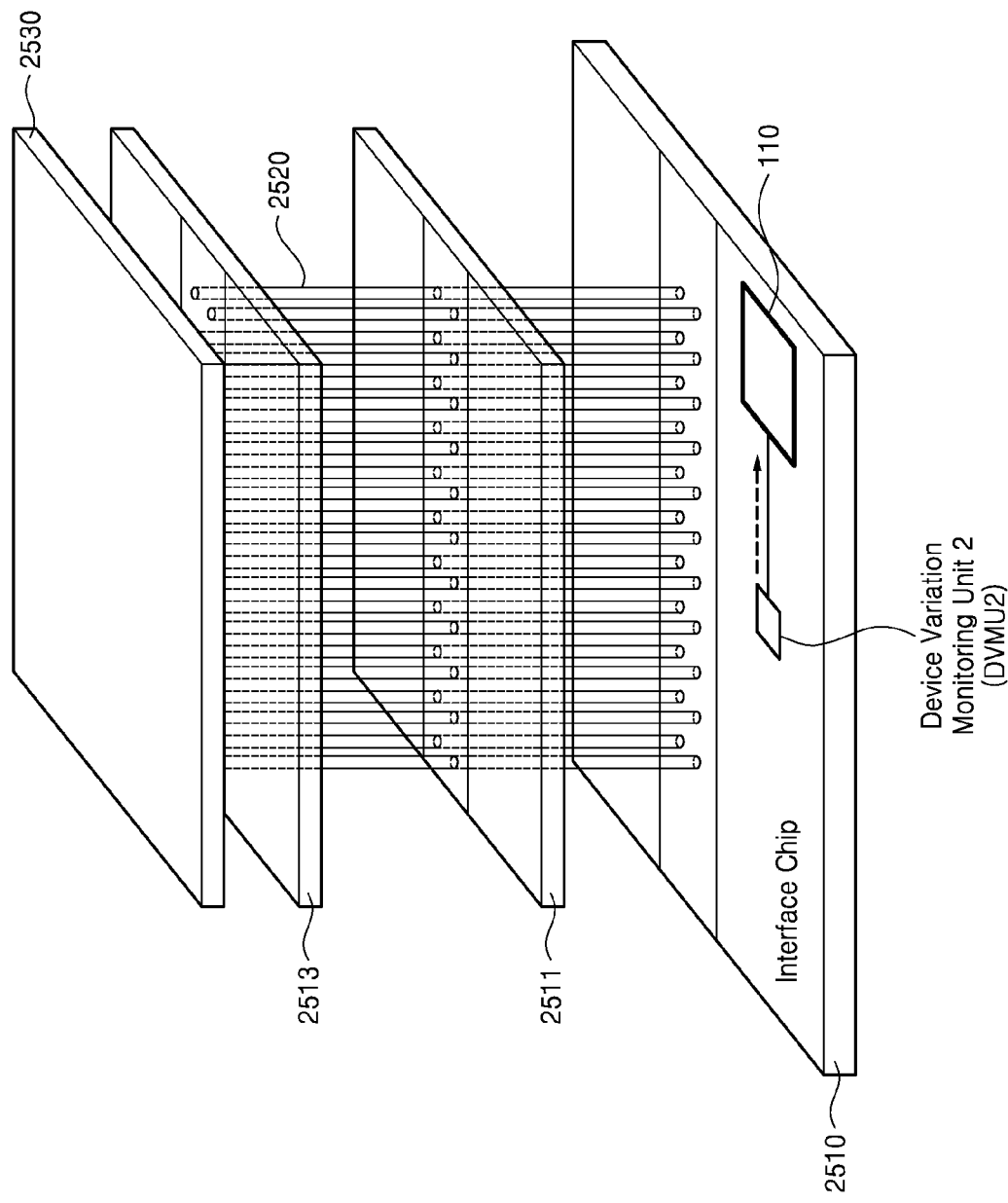
FIG. 16C is a schematic diagram illustrating a memory system comprising stacked TSVs, according to still another embodiment of the inventive concept.

FIG. 16C is a schematic diagram illustrating a memory system comprising stacked TSVs, according to still another embodiment of the inventive concept.

Referring to FIG. 16C, magnetic field protection layer 2530 is positioned at the highest layer, and thereby blocking a magnetic field from outside. Each of reference numerals 2511 and 2513 in FIG. 16C indicates an MRAM chip, and each of MRAM chips 2511 and 2513 and interface chip 2510 are connected to each other through TSVs and bumps. The structure illustrated in FIG. 16C can potentially decrease a malfunction of all of stacked chips 2510, 2511 and 2513.

FIGS. 17A-17D are block diagrams illustrating various interfaces for memory systems according to different embodiments of the inventive concept. In the examples of FIGS. 17A-17D, an MRAM core 2100 (e.g., 2100B, 2100C, 2100D, or 2100E) of each memory device 2000 (e.g., 2000B, 2000C, 2000D, or 2000E) comprises a control and voltage generation unit 205 and a first device variation monitoring unit 240 as described above.

Figure 17A:
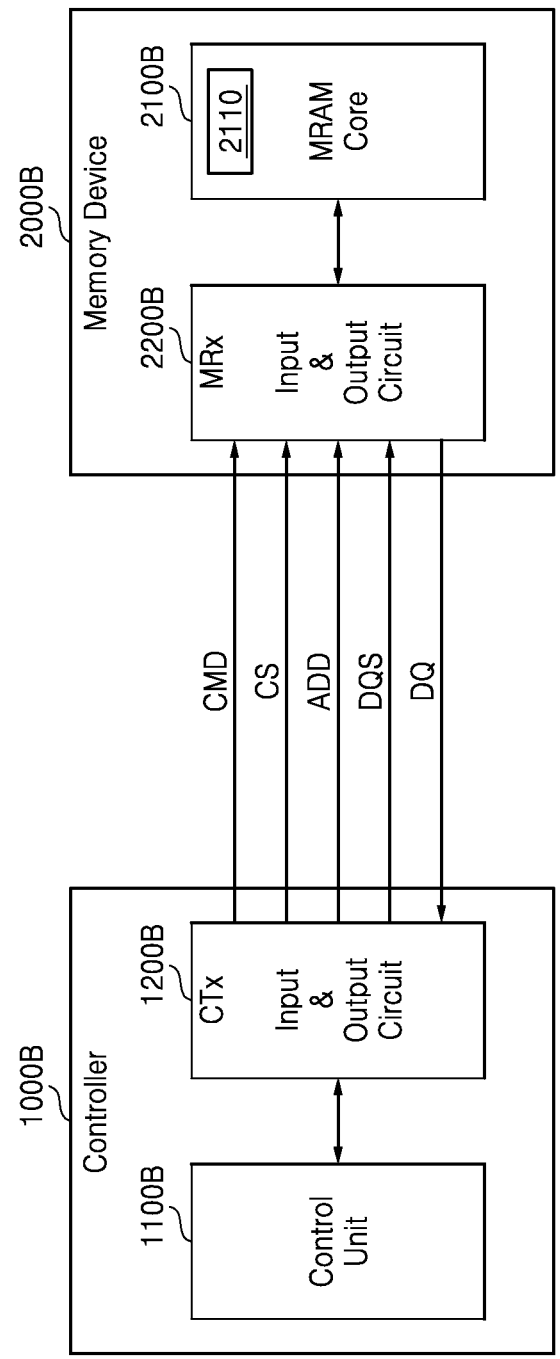
FIG. 17A is a block diagram illustrating an interface of a memory system according to an embodiment of the inventive concept.

Referring to FIG. 17A, a memory system comprises a controller 1000B and a memory device 2000B. Controller 1000B, which may perform substantially the same function as controller 100, comprises a control unit 1100B, which may perform substantially the same function as control unit 110, and an input/output circuit CTx 1200B.

Memory device 2000B comprises an MRAM core 2100B, which further comprises a sensing and storage circuit 2110 and an input/output circuit MRx 2200B. Input/output circuit CTx 1200B of controller 1000B comprises an interface transmitting a command CMD, a control signal CS, an address ADD, and a data strobe signal DQS to memory device 2000B, and transmitting and receiving data DQ.

An input/output circuit MRx 2200B of memory device 2000B receives a command CMD, a control signal CS, an address ADD, and a data strobe signal DQS, and comprises an interface transmitting and receiving data DQ.

Figure 17B:
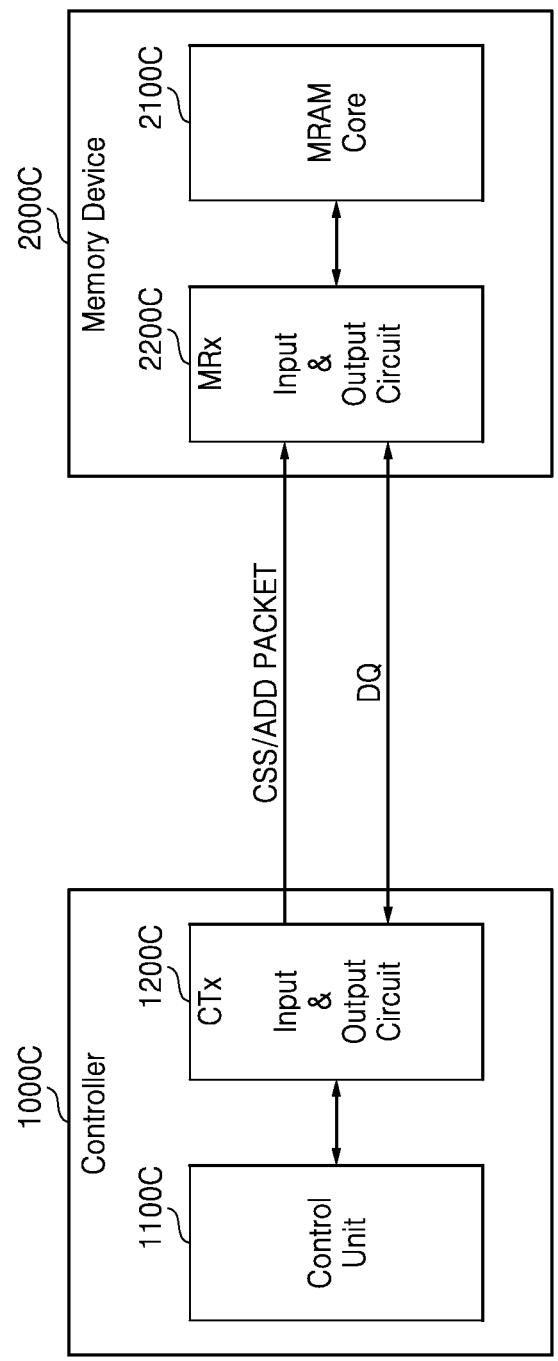
FIG. 17B is a block diagram illustrating an interface of a memory system according to another embodiment of the inventive concept.

Referring to FIG. 17B, an input/output circuit CTx 1200C of a controller 1000C comprises an interface transmitting a chip selection signal CSS and an address ADD in one packet CSS/ADD PACKET based on the control of a control unit 1100C, and transmitting and receiving data DQ.

An input/output circuit MRx 2200C of a memory device 2000C interfaces signals CSS/ADD PACKET and DQ transmitted and received between MRAM core 2100C and the input/output circuit CTx 1200C of controller 1000C.

Figure 17C:
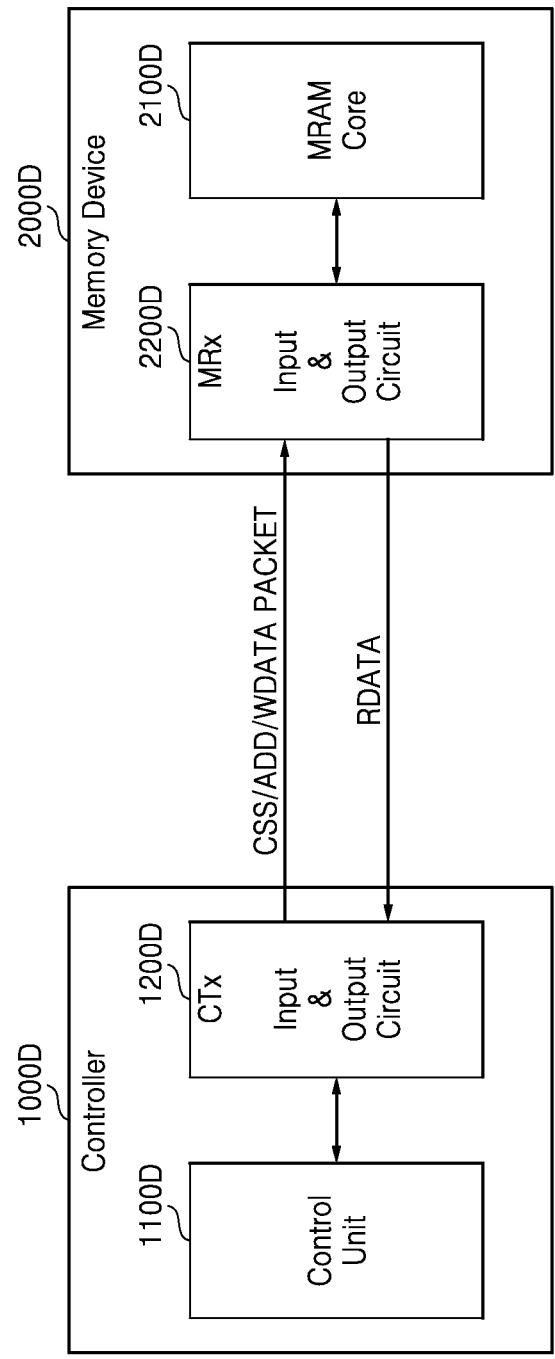
FIG. 17C is a block diagram illustrating an interface of a memory system according to another embodiment of the inventive concept.

Referring to FIG. 17C, an input/output circuit CTx 1200D of a controller 1000D comprises an interface transmitting a chip selection signal CSS, an address ADD, and write data WDATA in one packet CSS/ADD/WDATA PACKET, and receiving read data RDATA.

An input/output circuit MRx 2200D of memory device 2000D interfaces signals CSS/ADD/WDATA PACKET and RDATA transmitted and received between MRAM core 2100D and the input/output circuit CTx 1200D of controller 1000D.

Figure 17D:
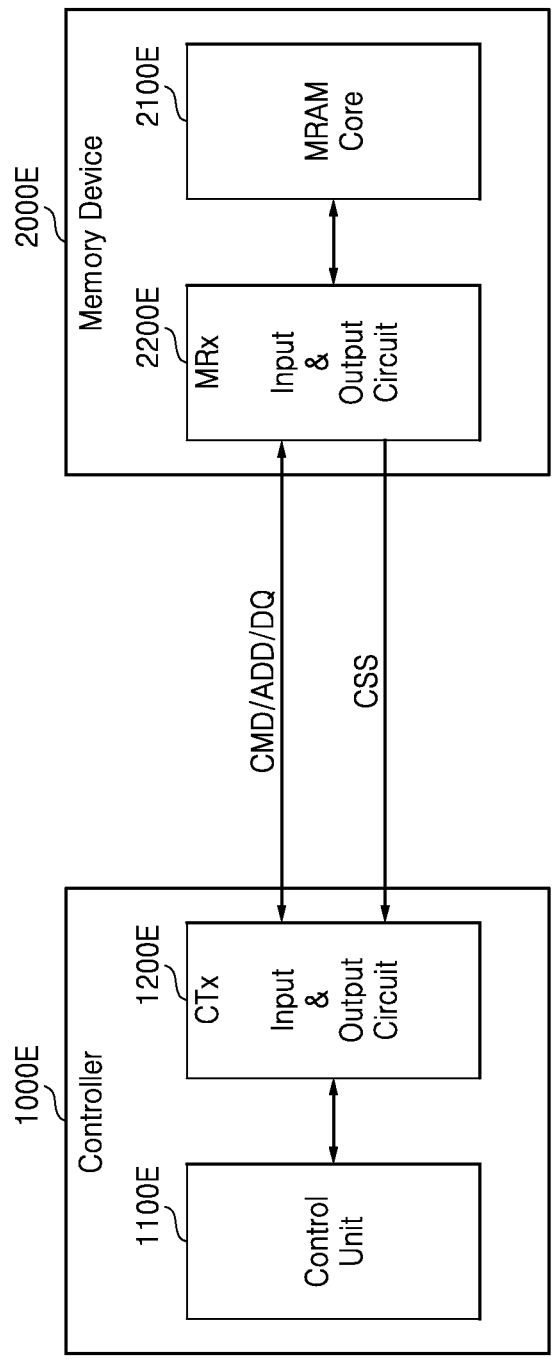
FIG. 17D is a block diagram illustrating an interface of a memory system according to another embodiment of the inventive concept.

Referring to FIG. 17D, an input/output circuit CTx 1200E of a controller 1000E comprises an interface transmitting and receiving a command CMD, an address ADD, and data DQ and receiving a chip selection signal CSS according to a control of a control unit 1100E. An input/output circuit MRx 2200E of a memory device 2000E interfaces signals CMD/ADD/DQ and CSS transmitted and received between an MRAM core 2100E and the input/output circuit CTx 1200E of controller 1000E.

Figure 18A:
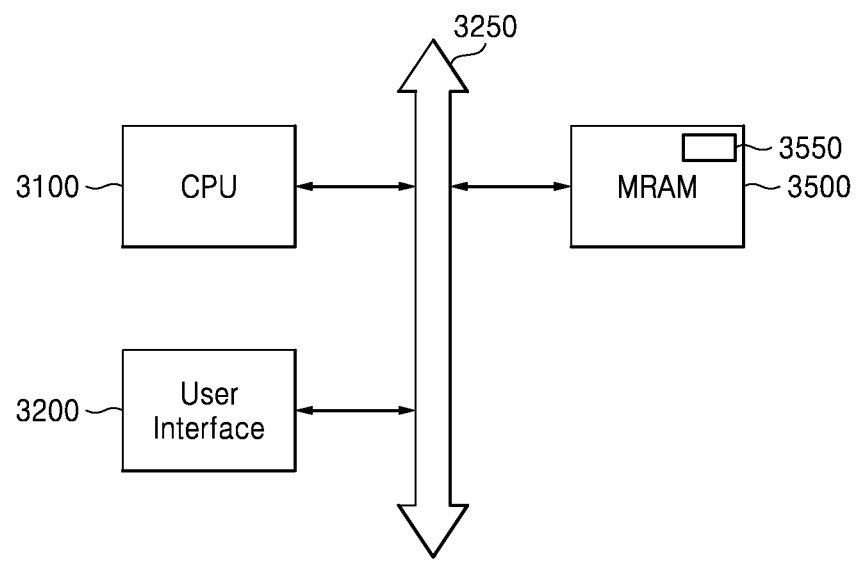
FIG. 18A is a block diagram illustrating a bus connection for a memory system according to an embodiment of the inventive concept.

FIG. 18A is a block diagram illustrating a bus connection for a memory system according to an embodiment of the inventive concept.

Referring to FIG. 18A, the memory system comprises a CPU 3100, a user interface 3200, and an MRAM 3500. Components 3100, 3200, and 3500 are connected to each other through a system bus 3250. MRAM 3500 comprises a circuit block 3550 comprising the control and a voltage generation unit 205 and a first device variation monitoring unit 1 240 as described above.

Figure 18B:
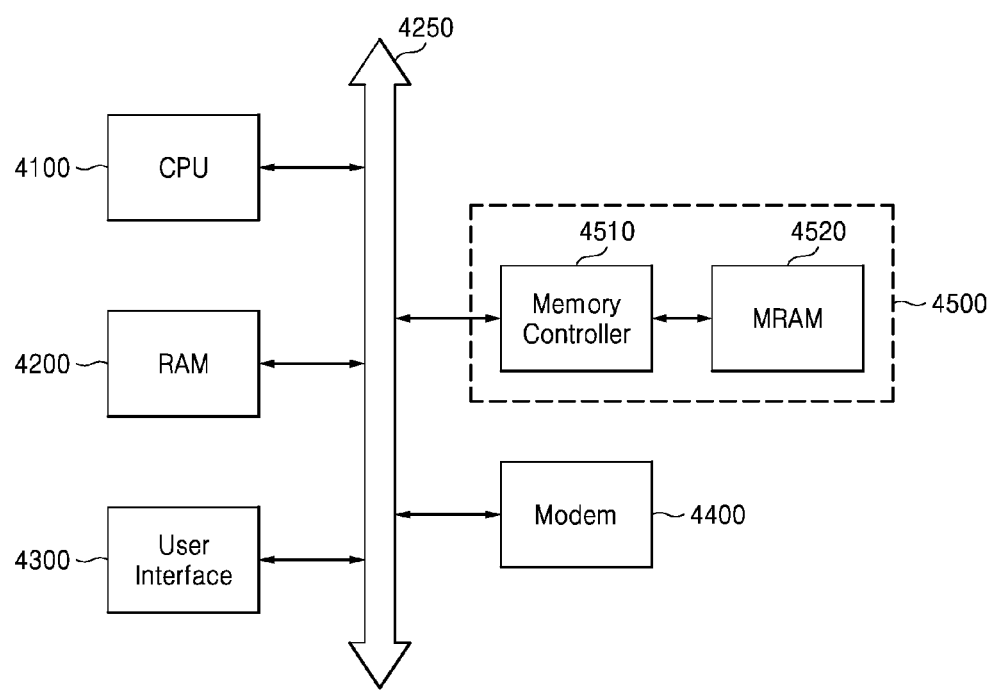
FIG. 18B is a block diagram illustrating a bus connection for a memory system according to another embodiment of the inventive concept.

FIG. 18B is a block diagram illustrating a bus connection for a memory system according to another embodiment of the inventive concept.

Referring to FIG. 18B, a memory system 4500, a CPU 4100, a random access memory (RAM) 4200, a user interface 4300, and a modem 4400 are connected through a system bus 4250.

Memory system 4500 comprises a memory controller 4510 and an MRAM 4520. A structure and a function of memory controller 4510 are substantially the same as those of controller 100, and a structure and a function of MRAM 4520 are substantially the same as those of MRAM 200.

As indicated by the foregoing, in certain embodiments of the inventive concept, a method and/or a memory system provides a variable operating voltage for write and read operations of a memory cell for the memory cell, which can potentially reduce the rate of data errors, improve operating speed, and save power.

The foregoing is illustrative of embodiments and is not to be construed as limiting thereof. Although a few embodiments have been described, those skilled in the art will readily appreciate that many modifications are possible in the embodiments without departing from the scope of the inventive concept as defined in the claims.

What is claimed is:

1. A magneto-resistive random access memory (MRAM), comprising:
   an MRAM cell array having an MRAM cell; and
   a control and voltage generation unit configured to generate a back bias voltage for the MRAM cell,
   wherein the control and voltage generation unit comprises:
   a command decoder configured to generate a decoding signal in response to a command output from a memory controller; and
   a voltage controller and generator configured to generate the back bias voltage with a magnitude based on the decoding signal and a reset signal output from the memory controller.

2. The MRAM of claim 1, wherein the MRAM cell comprises a cell transistor and a magnetic tunnel junction (MTJ), the voltage controller and generator provides the back bias voltage to the cell transistor, and the command is a write command or a read command.

3. The MRAM of claim 2, wherein the back bias voltage has a first magnitude that is a positive value when the command is the write command and a second magnitude that is a negative value when the command is the read command.

4. A memory system, comprising:
   a memory controller comprising a control unit configured to generate a command and a voltage selection signal; and
   a magneto-resistive random access memory (MRAM) comprising a MRAM cell array having an MRAM cell, and a control and voltage generation unit configured to generate an operating voltage for the MRAM cell,
   wherein the control and voltage generation unit comprises:
   a command decoder configured to generate a decoding signal in response to the command; and
   a voltage controller and generator configured to generate the operating voltage with a magnitude determined by the decoding signal and the voltage selection signal.

5. The memory system of claim 4, wherein the memory controller comprises:
   a device variation monitoring unit configured to monitor at least one of temperature variation, process variation, and voltage variation of the memory controller; and
   the control unit configured to generate the command and the voltage selection signal based on an output signal of the device variation monitoring unit.

6. The memory system of claim 5, wherein the device variation monitoring unit comprises a temperature sensor configured to determine temperature of the MRAM and generate temperature information, a process variation information storage device configured to store process variation information of the MRAM, or a voltage sensor configured to generate present voltage information for a present voltage of the MRAM.

7. The memory system of claim 4, wherein the MRAM further comprises:
   a device variation monitoring unit configured to monitor at least one of temperature variation, process variation, and voltage variation of the MRAM and transmit a monitoring result to the memory controller or the voltage controller and generator,
   wherein the memory controller generates the voltage selection signal based on the monitoring result or the voltage controller and generator adjusts the operating voltage based on the monitoring result.

8. The memory system of claim 7, wherein the device variation monitoring unit comprises a temperature sensor configured to determine temperature of the MRAM and generate temperature information.

9. The memory system of claim 7, wherein the device variation monitoring unit comprises a process variation information storage device configured to store process variation information of the MRAM.

10. The memory system of claim 7, wherein the device variation monitoring unit comprises a voltage sensor configured to generate present voltage information for a present voltage of the MRAM.

11. The memory system of claim 4, wherein the voltage selection signal comprises multiple bits.

12. A memory system, comprising:
    a memory controller comprising a control unit configured to generate a command and a reset signal; and
    a magneto-resistive random access memory (MRAM) comprising an MRAM cell array having an MRAM cell, and a control and voltage generation unit configured to generate a back bias voltage for the MRAM cell,
    wherein the control and voltage generation unit comprises:
    a command decoder configured to generate a decoding signal in response to the command; and
    a voltage controller and generator configured to generate the back bias voltage with a magnitude based on the decoding signal and the reset signal.

13. The memory system of claim 12, wherein the MRAM cell comprises a cell transistor and a magnetic tunnel junction (MTJ), the voltage controller and generator provides the back bias voltage to the cell transistor, and the command is a write command or a read command.

14. The memory system of claim 12, wherein the back bias voltage has a first magnitude where the command is a write command and a second magnitude where the command is a read command.

15. The memory system of claim 14, wherein the first magnitude has a positive value and the second magnitude has a negative value.

* * * * *